(12) United States Patent
Ouellet et al.

(10) Patent No.: US 7,160,752 B2
(45) Date of Patent: Jan. 9, 2007

(54) FABRICATION OF ADVANCED SILICON-BASED MEMS DEVICES

(75) Inventors: Luc Ouellet, Granby (CA); Robert Antaki, St. Luc (CA)

(73) Assignee: Dalsa Semiconductor Inc., Waterloo (CA)

( * ) Notice: Subject to any disclaimer, the term of this patent is extended or adjusted under 35 U.S.C. 154(b) by 0 days.

(21) Appl. No.: 11/242,960

(22) Filed: Oct. 5, 2005

(65) Prior Publication Data

US 2006/0166403 A1    Jul. 27, 2006

Related U.S. Application Data

(63) Continuation of application No. 10/410,158, filed on Apr. 10, 2003, now abandoned.

(60) Provisional application No. 60/447,019, filed on Feb. 13, 2003, provisional application No. 60/445,426, filed on Feb. 7, 2003.

(51) Int. Cl.
*H01L 21/00* (2006.01)
(52) U.S. Cl. .......................................... 438/52; 438/48
(58) Field of Classification Search .................. 438/48, 438/52
See application file for complete search history.

(56) References Cited

U.S. PATENT DOCUMENTS

| | | | | |
|---|---|---|---|---|
| 5,090,254 A | * | 2/1992 | Guckel et al. | 73/862.59 |
| 5,326,726 A | * | 7/1994 | Tsang et al. | 438/52 |
| 5,342,652 A | * | 8/1994 | Foster et al. | 427/253 |
| 5,902,650 A | * | 5/1999 | Feng et al. | 427/578 |
| 6,063,703 A | * | 5/2000 | Shinriki et al. | 438/653 |
| 6,081,021 A | * | 6/2000 | Gambino et al. | 257/530 |
| 6,635,528 B1 | * | 10/2003 | Gilbert et al. | 438/253 |

* cited by examiner

*Primary Examiner*—Asok Kumar Sarkar
(74) *Attorney, Agent, or Firm*—Marks & Clerk; Richard J. Mitchell

(57) ABSTRACT

A micro-electro-mechanical (MEM) device and an electronic device are fabricated on a common substrate by fabricating the electronic device comprising a plurality of electronic components on the common substrate, depositing a thermally stable interconnect layer on the electronic device, encapsulating the interconnected electronic device with a protective layer, forming a sacrificial layer over the protective layer, opening holes in the sacrificial layer and the protective layer to allow the connection of the MEM device to the electronic device, fabricating the MEM device by depositing and patterning at least one layer of amorphous silicon, and removing at least a portion of the sacrificial layer. In this way, the MEM device can be fabricated after the electronic device on the same substrate.

23 Claims, 23 Drawing Sheets

| | | |
|---|---|---|
| S1: | Wafer thickness: | 675 ± 15 μm |
| S2: | Pad oxide layer thickness: | 2.5 ± 0.15 μm |
| S3: | Surface polysilicon layer thickness: | 0.45 ± 0.05 μm |
| S4: | Sacrificial oxide layer thickness: | 1.6 ± 0.2 μm |
| S5: | Structural epipoly layer thickness: | 10.3 ± 1.0 μm |
| S6: | Metal layer thickness: | 1.3 ± 0.2 μm |

Nine layers laminated structure

TiN barrier under 1st metal

Reflowed 1st metal

Reflowed 1st metal (Top)

Reflowed 1st metal on P+

Reflowed 1st metal TiN cap

Reflowed 1st metal on N+

Reflowed 1st metal on Poly 1

Reflowed 1st metal on Polycid

2nd metal contact to 1st metal

Non-reflowed 2nd metal

Silicon nodules in 2nd metal

Silicon nodules in 2nd metal

Silicon atomic radius is 111 pm

Phosphorus atomic radius is 98 pm

Lattice dilation coeffient curve for implanted phosphorus into single crystal silicon

FABRICATION OF ADVANCED SILICON-BASED MEMS DEVICES

CROSS REFERENCE TO RELATED APPLICATIONS

This application is a continuation of U.S. application Ser. No. 10/410,158 filed Apr. 10, 2003 now abandoned and claims the benefit under 35 USC 119(e) of prior U.S. provisional application Ser. No. 60/445,426 filed Feb. 7, 2003 and Ser. No. 60/447,019 filed Feb. 13, 2003.

FIELD OF THE INVENTION

This invention relates to the fabrication of MEMS (Micro-Electro-Mechanical Systems) devices, and more particularly to a method of fabricating MEMS devices that permits the fabrication of advanced integrated circuits prior to the fabrication of the mechanical components on the same device.

BACKGROUND OF THE INVENTION

The production of advanced silicon-based micro-electromechanical systems, MEMS, requires the integration of moving mechanical parts and controlling, sensing or interfacing integrated circuits, and sometimes high-voltage integrated circuits capable actuating the mechanical parts.

The processes used to produce advanced MEMS from silicon-based structural materials typically require a high-temperature stress-relief step to reduce the mechanical stress of silicon-based structural material and allow its proper machining and mechanical release of the moving parts. This high-temperature stress-relief imposes the integrated circuit to be fabricated after the high surface topology mechanical parts of these advanced MEMS. This is an undesirable combination since advanced integrated circuits require very fine lithography to be performed using short depth-of-focus equipment. The high surface topology imposed by the mechanical parts is then to be eliminated by proper chemical-mechanical polishing (CMP), or other means, to allow the integrated circuit to be fabricated. The high-temperature stress-relief restriction, the extra cost associated with CMP planarization, and the need to fabricate the integrated circuit after the mechanical parts are significant restrictions on existing processes.

The integration of moving mechanical parts, of controlling, sensing or interfacing integrated circuits and, sometimes, of high-voltage integrated circuits capable of powerful actuation of the mechanical parts has been so far limited by the high-temperature stress-relief of polysilicon at temperatures exceeding 1000° C.

Examples of Restrictive High-Temperature Stress-Relief Processes of Polysilicon at Temperatures Exceeding 1000° C.

Analog Devices' Modular MEMS Process

A first well known example of a restrictive high-temperature stress-relief process is Analog Devices' Modular-MEMS process involving the integration of a 6 μm thick moving polysilicon structural material and a 5V 0.8 μm CMOS process for the control, sensing and interfacing functions. An example of this process is described in the following reference: Moorthi Palaniapan, Roger T. Howe, John Yasaitis, "Integrated Surface-Micromachined Z-axis Frame Microgyroscope", International Electron Device Meeting 2002, San Francisco, Dec. 8–11, 2002, Session 8: Detectors, sensors and displays—Recent advances in inertial and biological MEMs. This reference shows that Analog Devices' Modular MEMS process uses a high-temperature stress-relief of a 6 μm thick moving polysilicon structural layer forming the mechanical parts. Following this high-temperature stress-relief a thick selective epitaxial silicon layer is epitaxially grown and used as substrate for the integrated circuit fabricated after a chemical-mechanical polishing, CMP, is performed as to achieve a smooth surface. The epitaxial silicon deposition is typically performed at a temperature of about 1000–1200° C. and then result in another stress relief of the structural polysilicon. The fabrication of the integrated circuit in this grown and polished epitaxial silicon will result in advanced MEMS such as Analog Devices' accelerometers and micro-gyroscopes.

The Analog Devices' Modular MEMS process shown at FIG. 1 is characterized by the following requirements:

a. The integrated circuit must be fabricated after the high surface topology mechanical parts. Since advanced integrated circuits involve very fine structures to be fabricated into a smooth substrate using short depth-of-focus photo equipment, a planar substrate with smooth surface finish is to be achieved following the micro-machining of these mechanical parts.

b. High-temperature stress-relief must be performed on the structural polysilicon after the MEMS fabrication, during the epitaxial growth of the substrate to be used for the integrated circuit portion.

c. It requires a CMP step after the epitaxial growth to achieve the required planarity and surface finish.

d. The integrated circuit must be fabricated after the CMP in the polished epitaxial silicon regions.

Analog Devices' Modular MEMS process requires the use of a high-temperature stress-relief step of the MEMS structures during the epitaxial growth of the substrate to be used for the integrated circuit portion. This in turn imposes the use of CMP and the fabrication of the integrated circuit after fabrication of the mechanical parts.

SAIT's MEMS Process

A second example of such a restrictive high-temperature stress-relief process is Samsung Advanced Institute of Technology's (SAIT's) MEMS process involving the integration of a double polysilicon MEMS device with a standard integrated circuit. An example of this process is shown in the following reference: Y B Gianchandani, H Kim, M Shinn, B Ha, B Lee, K Najafi and C Song, "A fabrication process for integrating polysilicon microstructures with post-processed CMOS circuits", J. Micromech. Microeng. 10 (2000) 380–386. This reference shows that SAIT's MEMS process uses a trench created using KOH to recess the microstructural polysilicon of the mechanical parts protected by an oxide/nitride cap layer during the fabrication of the integrated circuit AFTER the fabrication of the mechanical parts. The 1200° C. and 16 hours drive-in diffusion of the p-well implant is used as stress-relief of the microstructural polysilicon as to achieve advanced MEMS. SAIT's MEMS process is shown in FIG. 2 and comprises the following steps:

a. Create trench using KOH and a thermal oxide mask, deposit bottom oxide and nitride insulation layers, deposit and pattern first polysilicon layer.

b. Deposit and pattern first sacrificial oxide layer, deposit and pattern microstructural (second) polysilicon layer. In both of these steps the films are stripped from the CMOS circuit region before patterning the layers at the bottom of the trench.

c. Deposit and pattern second sacrificial oxide, deposit and pattern third polysilicon layer.

d. Strip the nitride from unrecessed regions and pattern the top cap layer protecting the MEMS parts. Perform the complete CMOS process until the metal interconnect layer. The p-well implant followed by a drive-in diffusion performed at 1200° C. for 16 h in an ambient of nitrogen and oxygen ensures stress relieving of the microstructural polysilicon.

e. Open contact holes in the MEMS regions, deposit and pattern aluminum for circuit interconnect and lead transfers between circuit and MEMS regions.

f. Cover aluminum metallization with a protective layer, remove protective cap layer from the MEMS regions, etch all sacrificial layers in BHF, remove protective layer from CMOS regions.

The SAIT process shown in FIG. 2 is then characterized by the following requirements:

a. It also requires the integrated circuit to be fabricated after the high surface topology mechanical parts. This integrated circuit is fabricated at least 100 μm away from the recessed region where the mechanical parts are located. All layers constituting the integrated circuit are removed from the recessed region using the protective oxide/nitride cap layer as etch-stop and protection of the mechanical parts. Keeping the integrated circuit in the planar region of the silicon wafer and away from the recessed region eliminates the depth-of-focus problem.

b. It also requires a high-temperature stress-relief of the structural polysilicon. This is performed at 1200° C. for 16 hours during the drive-in diffusion of the p-well implant after the MEMS fabrication.

c. It does not require a CMP to achieve the required planarity and surface finish because the integrated circuit is fabricated at least 100 μm away from the recessed region where the mechanical parts are located and because the interconnections between the integrated circuit and mechanical parts are performed over the sloped region achieved by the KOH etch.

d. It requires the integrated circuit to be fabricated after the mechanical parts, into the horizontal regions, away from the recessed region where the mechanical parts are located.

SAIT's MEMS process also imposes the use of a high-temperature stress-relief of the MEMS structures at 1200° C. for 16 hours during the drive-in diffusion of the p-well implant of the integrated circuit and imposes the fabrication of the integrated circuit AFTER the mechanical parts.

Sandia's IMEMS Process:

A third example of such a restrictive high-temperature stress-relief process is Sandia National Laboratories' (Sandia's) Integrated MicroElectroMechanical Systems (IMEMS) process involving the integration of a MEMS device incorporating at least two levels of polysilicon with an integrated circuit. An example of this process is shown in the following reference: J. H. Smith, S. Montague, J. J. Sniegowski, J. R. Murray, and P. J. McWhorter, "Embedded micromechanical devices for the monolithic integration of MEMS with CMOS", IEDM 1995 proceedings, pp. 609–612. This reference shows that Sandia's MEMS process uses a trench created using KOH to recess the mechanical parts in a shallow trench, requires polishing the wafer using CMP, and requires sealing the mechanical parts in the trench using a silicon nitride layer. A high-temperature stress-relief is performed after the mechanical parts are embedded in the trench prior to processing conventional CMOS, bipolar or BiCMOS processes. This high-temperature stress-relief of the micro-structural polysilicon ensures that the subsequent thermal budget of the CMOS, bipolar or BiCMOS processing will not affect the mechanical properties of the polysilicon and will achieve an operational IMEMS. Sandia's IMEMS process shown at FIG. 3 is then characterized by the following:

a. It requires the CMOS bipolar or BiCMOS devices to be fabricated after the high surface topology mechanical parts. Again, since advanced integrated circuits involve very fine structures to be fabricated into a smooth substrate using short depth-of-focus photo equipment, a planar substrate with smooth surface finish is to be achieved following the micro-machining of these mechanical parts;

b. It requires a high-temperature stress-relief of the structural polysilicon. This is performed after the MEMS fabrication and prior the CMOS bipolar or BiCMOS processing;

c. It requires a CMP to be performed after the MEMS fabrication and prior the CMOS bipolar or BiCMOS processing;

d. It requires the CMOS bipolar or BiCMOS to be performed after the CMP into the polished silicon regions.

The Sandia's IMEMS process also imposes the use of a high-temperature stress-relief of the MEMS structures prior the integrated circuit processing, imposes the use of CMP and imposes the fabrication of the integrated circuit after the mechanical parts.

MEMSCAP's PolyMUMPs Process:

A fourth example of such a restrictive process is MEMSCAP's Polysilicon Multi-User MEMS process, MUMP, of the following reference: David A. Koester, Allen Cowen, Ramaswamy Mahadevan and Busbee Hardy, "PolyMUMPs design handbook, revision 8.0", 2002. This surface micromachining process uses three high-temperature stress-relieves of phosphorus-doped polysilicon, namely:

a. A high-temperature stress-relief of a 0.5 μm thick Poly 0 while diffusing the phosphorus atoms of a 2.0 μm thick phosphosilicate layer at 1050° C. for 1 hour in argon;

b. A high-temperature stress-relief of a 2.0 μm thick Poly 1 while diffusing the phosphorus atoms of a 0.2 μm thick phosphosilicate layer at 1050° C. for 1 hour in argon;

c. A high-temperature stress-relief of a 1.5 μm thick Poly 2 while diffusing the phosphorus atoms of a 0.2 μm thick phosphosilicate layer at 1050° C. for 1 hour in argon.

MEMSCAP's MUMPs process shown in FIG. 4 is then characterized by the following:

a. It requires three 1050° C. 1 hour each high-temperature stress-relieves to dope and stress-relieve the three layers of polysilicon;

b. Because of these three successive 1050° C. 1 hour each dopant diffusions and stress-relieves, any tentative of integrating an integrated circuit to the MUMPs process would require the integrated circuit to be fabricated AFTER the MUMPs as to prevent the destruction of the junctions during such restrictive stress-relief steps.

Robert Bosch GmbH's Surface Micromachining Process

A fifth example of such a restrictive high-temperature stress-relief process is Robert Bosch GmbH's surface micromachining process described in the following three references: Horst Mjinzel, Michael Offenberg, Klaus Heyers, Bernhard Elsner, Markus Lutz, Helmut Skapa, Heinz-Georg Vossenberg, Nicholas Buchan, Eckhard Graf, U.S. Pat. No. 5,937,275, "Method fof producing acceleration sensors", Robert Bosch GmbH, filed on Jul. 9, 1996 and granted on Aug. 10, 1999; M. Furtsch, M. Offenberg, H. Muenzel, J. R. Morante, 'Comprehensive study of processing parameters influencing the stress and stress gradient of thick polysilicon layers', SPIE Conference Proceedings 'Micromachining and microfabrication process technology III, conference proceedings', SPIE Vol. 3223, pp. 130–141, Austin Tex., Sep. 29–30, 1997. http://www.europractice.bosch.com/en/download/customer_support.pdf This process uses two levels of polysilicon, namely:
a. A first 0.45 µm thick surface polysilicon layer deposited at 630° C. by Low Pressure Chemical Vapor Deposition (LPCVD), implanted with antimony and annealed at 1000° C. in an oxygen ambient as to drive and activate the Sb dopant;
b. A second 10.3 µm thick structural epipoly layer is deposited as a 11.8 µm thick layer at a rate of 3.5 µm/minute and at a temperature of 1180° C. in a ASM Epsilon One Model-E2 single wafer epitaxy reactor using a trichlorosilane (SiHCl3), hydrogen (H2), and phosphine (PH3) process. The resulting 11.8 µm thick structural epipoly layer has a very rough surface (Ra of 260 nm) unacceptable for further processing and thus requiring the use of CMP to reduce the thickness of the structural epipoly layer to 10.3 µm and its surface roughness to about 5 nm.
c. Robert Bosch GmbH's surface micromachining process shown in FIG. 5 is then characterized by the following:

It experiences two high-temperature stress-relief steps: A first, at 1000° C. in an oxygen ambient, to drive and activate the Sb dopant; and a second, at 1180° C., for the deposition of the structural epipoly layer;

Because of these two successive high-temperature stress-relief steps, any tentative of integrating an integrated circuit to Robert Bosch GmbH's surface micromachining process would also require the integrated circuit to be fabricated AFTER the MEMS process as to prevent the destruction of the junctions during such restrictive heat treatments.

Sandia's CMOS-First, Micromechanics-Last MEMS Process

A sixth example of such a restrictive high-temperature stress-relief process is reported by Sandia's CMOS-first, micromechanics-last MEMS process involving the integration of a MEMS device with an integrated circuit where conventional aluminium interconnects are completely replaced by tungsten interconnects to prevent melting the aluminium interconnects and allow the integrated circuit to withstand the 1100° C., 3 hours heat treatment required for the stress-relief of the micro-machined polysilicon. An example of this all-tungsten process is shown in the following three references: Stephen Montague, James H. Smith, Jeffrey. J. Sniegowski, Paul J. McWhorter, U.S. Pat. No. 5,798,283, "Method for integrating microelectromechanical devices with electronic circuitry", Sandia National laboratories, filed on Sep. 6, 1995 and granted on Aug. 25, 1998; Carole C. Barron, James G. Flemming, Stephen Montague, U.S. Pat. No. 5,963,788, "Method for integrating microelectromechanical devices with electronic circuitry", Sandia National laboratories, filed on Nov. 19, 1997 as continuation in-part of application Ser. No. 08/524,700 (U.S. Pat. No. 5,798,283) and granted on Oct. 5, 1999; James H. Smith, Stephen Montague, and Jeffrey. J. Sniegowski, "Material and processing issues for the monolithic integration of microelectronics with surface-micromachined polysilicon sensors and actuators", Micromachining and Microfabrication '95, SPIE, October 1995.

These references show that Sandia's CMOS-first, micromechanics-last MEMS process of FIG. 6 fabricates the integrated circuit before the mechanical parts, thus reducing the surface topology and preventing the need for CMP. This is an improvement over the afore-mentioned Prior Art references but, following the integrated circuit fabrication, this process still requires a very restrictive 3 hours duration and 1100° C. stress-relief of the structural polysilicon. To enhance the thermal stability of the integrated circuit, aluminum interconnects are completely replaced by 1.0 µm thick low-stress tungsten interconnects deposited by chemical vapour deposition, CVD. In order to separate the tungsten from the underlying silicon at the contacts an adhesion layer/diffusion barrier stack of 15 nm of selective titanium silicide, TiSi, followed 50 nm of titanium nitride, TiN, is used. Where tungsten metallization is deposited over the field oxide, only the TiN layer is used. Since it is difficult to bond aluminium or gold bond wires to tungsten, bond pads are formed by using the structural polysilicon deposited on top of a 50 nm TiN diffusion barrier and the 1 micron of tungsten. The process is unstable because the compressive stress and surface roughness of the tungsten films are causing processing difficulties, such as delamination, or lifting, of the bondpads and photolithographically instabilities with projection steppers. A manually-aligned contact aligner has to be used; the TiN diffusion barrier sometimes fail during the 3 hours, 1100° C. stress-relief of the structural polysilicon, thus forming porous WTiSi and WSi at the basis of the contacts; and the out-diffusion of boron from the p+ source/drain implants in silicon causes a severe performance degradation of the p-channel devices due to an increase in contact resistance between tungsten and p-type silicon during the 3 hours, 1100° C. stress-relief of the structural polysilicon;

Because of the problems encountered in attempting to bring this technology to a manufacturing facility, Sandia decided to try other approaches besides the all-tungsten, CMOS-first, micromechanics-last MEMS process involving the required 3 hours duration and 1100° C. stress-relief of the structural polysilicon.

At this point, it is clear that the restrictive high-temperature stress-relief of the various upper-described popular MEMS processes prevents the integration of the integrated circuit BEFORE the micro-machining steps and prevents any type of modular integration of these micro-machining steps over the integrated circuit.

It is clear that any integration scenarios of these micro-machining steps over an integrated circuit require to stress-relief of structural silicon-based layers at a much lower temperature then 1000° C. The following will review the known techniques used to reduce the stress-relief temperature of deposited silicon films.

The techniques used to reduce the stress-relief temperature of deposited silicon films University of Michigan's Low-Stress Polysilicon Process A first example of a technique used to reduce the stress-relief temperature of un-doped silicon films is provided by the following publications from Universitry of Michigan: Khalil Najafi and Carlos. H. Mastrangelo, "Solid-state microsensors and smart structures", 1993 IEEE Ultrasonics Symposium, pp. 341–350; Carlos. H. Mastrangelo and William C. Tang, "Surface-micromachined capacitive differential pressure sensor with lithographically defined silicon diaphragm", Journal of microelectromechanical systems, Vol. 5, No. 2, June 1996; P.-C. Hsu, C. H. Mastrangelo, and K. D. Wise, "A high sensitivity polysilicon diaphragm condenser microphone", 1998 MEMS Conference, Heidelberg, Germany, Jan. 25–29, 1998; B. P. Gogoi and C. H. Mastrangelo, "Force Balanced Micromachined Pressure Sensors", IEEE Transactions on electron devices, IEEE Trans. Electron Dev., December 1999; B. P. Gogoi and C. H. Mastrangelo, "A low voltage force balanced pressure sensor with hermetically sealed servomechanism", IEEE MEMS '99 Conference, pp. 493–498, Orlando, Fla., January 1999; Kun Wang and Clark T.-C. Nguyen, "High-Order Medium Frequency Micromechanical Electronic Filters", Journal of microelectromechanical systems, Vol. 8, No. 4, December 1999; Robert D. White, Karl Grosh, "Design and characterization of a MEMS piezoresistive cochlear-like acoustic sensor", Proceedings of IMECE'02, 2002 ASME International Mechanical Engineering Congress and Exposition, New Orleans, La., Nov. 17–22, 2002.

This technique describes the deposition of a low-stress un-doped polysilicon at a pressure of 160 mTorr and at a temperature of about 590–610° C. This un-doped polysilicon is electrically non-conductive and a phosphorus implantation at an energy of 100 keV and a dose of about 1–2E16/$cm^2$ followed by an anneal at 950° C. for a few hours in nitrogen is required as to activate the phosphorus dopants and increase its electrical conductivity. This high-temperature stress-relief allow the mechanical stress of the electrically conductive polysilicon to be reduced to about 25 MPa but again limits the integration over an integrated circuit.

Alternatively, this technique describes the deposition of an un-doped polysilicon film at a temperature of 588° C. resulting in a non-conductive polysilicon having an as-deposited tensile stress of less then 100 MPa. Again, a phosphorus implantation at an energy of 50 keV and a dose of about 7E15/$cm^2$, followed by a one hour duration 1050° C. phosphorus activation and stress-relief in nitrogen reduce its residual stress as much as possible.

This technique then requires a post-deposition implantation and a few hours duration 950° C. stress-relief and activation or a one hour duration 1050° C. stress-relief and actuation of the deposited polysilicon. The few hours duration 950° C. stress-relief and activation is marginally better then the one associated with the upper-described Prior Art references and, again, any tentative of an integrating integrated circuit to University of Michigan's surface micromachining process would also require the integrated circuit to be fabricated AFTER the MEMS process as to prevent the destruction of the junctions during such restrictive heat treatments.

UC Berkeley's Low-Stress Un-Doped Porous Polysilicon

A second example of a technique used to reduce the stress-relief temperature of silicon films is provided by the following publications from UC Berkeley: K. S. Lebouitz, A. Mazaheri, R. T. Howe, and A. P. Pisano, "Vacuum Encapsulation of Resonant Devices Using Permeable Polysilicon," Proc. 12th International IEEE Conference on Micro Electro Mechanical Systems (MEMS '99), Orlando, Fla., pp. 470–5; Jeffrey D. Zahn, David Trebotich and Dorian Liepmann, "Microfabricated microdialysis microneedles for continuous medical monitoring", 1st Annual International IEEE-EMBS Special Topic Conference on Microtechnologies in Medicine & Biology 1, Oct. 12–14, 2000, Lyon, France; John McCaslin Heck, "Polycrystalline silicon germanium for fabrication, release and packaging of microelectromechanical systems", Ph. D. thesis, UC. Berkeley, Spring 2001; G. M. Dougherty, T. Sands, and A. Pisano, "The Materials Science of 'Permeable Polysilicon' Thin Films," Symposium B: Materials Science of Microelectromechanical Systems (MEMS) Devices IV, MRS Fall 2001 Meeting, Boston, Mass., Nov. 27, 2001, Materials Research Society vol. 687; http://www-bsac.eecs.berkeley.edu\~gmd\perm_page.html.

These publications show that an un-doped permeable polysilicon deposited at 597° C., 125 sccm SiH4, and 555 mTorr is characterized by a low residual stress due to pore defects (5–20 nm wide) between the polysilicon grains. This permeable polysilicon can also be deposited at 605° C., 250 sccm SiH4, and 550 mTorr. FIG. 7 shows the residual stress and surface structure of the un-doped permeable polysilicon. In order to use this low-stress un-doped permeable polysilicon as structural MEMS applications, it is again necessary to dope-and-activate it at a high-temperature ranging between 950° C. and 1050° C. as to activate the dopants and achieve low-stress conductive permeable polysilicon material. This described process to achieve doped permeable polysilicon would not be better then University of Michigan's surface micromachining process and would not substantially reduce the stress-relief temperature of the deposited conductive silicon material.

U. of Wisconsin's Low-Stress Re-Crystallized Polysilicon

A third example of a technique used to reduce the stress-relief temperature of un-doped silicon films is provided by the following publications from U. of Wisconsin: Henry Guckel and David W. Burns, U.S. Pat. No. 4,897,360, "Polysilicon thin film process", Wisconsin Alumni Research Foundation, filed on Dec. 9, 1987 and granted on Jan. 30, 1990; Henry Guckel and Jeffry Sniegowski, U.S. Pat. No. 5,090,254, "Polysilicon resonating beam transducers", Wisconsin Alumni Research Foundation, filed on Apr. 11, 1990 and granted on Feb. 25, 1992; Henry Guckel and Jeffry Sniegowski, U.S. Pat. No. 5,188,983, "Polysilicon resonating beam transducers and method of producing the same", Wisconsin Alumni Research Foundation, filed on Jan. 3, 1992 and granted on Feb. 23, 1993.

These cited prior art patents protect a technique to form a low-stress un-doped re-crystallized silicon-based film. This film is deposited at a temperature of about 591° C. by low pressure chemical vapour deposition, LPCVD, using a 100% pure silane ambient at a pressure of about 300 mTorr resulting in a typical deposition rate of 6.8 nm/minute. The 2.0 µm thick as-deposited un-doped film shows two phases: A first phase, located between the substrate and the film interior, characterized by an un-doped polycrystalline material with 30 nm to 300 nm grains having no measurable preferred orientation, and a second phase, located above the first polycrystalline phase and extending up to the film surface, characterized by an un-doped amorphous material with a measured surface roughness of as low as 0.8 nm rms. The mechanical stress of this two-phase as-deposited un-doped film is typically 300 MPa compressive and can be converted to predetermined tensile stress levels by a re-crystallization using a post-deposition stress-relief in nitrogen during which the un-doped amorphous phase changes to the un-doped crystalline phase. A 60 minutes duration 835° C. stress-relief in nitrogen produces a single phase re-crystallized un-doped polycrystalline film having a final tensile stress of 130 MPa and no measurable increase in surface roughness. A lower stress-relief temperature results in a re-crystallized un-doped film with a tensile stress of as low as 20 MPa. These low mechanical stress re-crystallized un-doped films are yet non-conductive. Post-deposition doping of these un-doped re-crystallized films still requires diffusion and activation at a high-temperature incompatible with a potential underlying aluminum-based integrated circuit.

Siemens Aktiengesellschaft's Low-Stress Layered Polysilicon Structures

A fourth example of a technique used to reduce the stress-relief temperature of silicon films is provided by the following publications from Siemens Aktiengesellschaft: Markus Biebl, U.S. Pat. No. 5,753,134, "Method for producing a layer with reduced mechanical stresses", Siemens Aktiengesellschaft, filed on Nov. 23, 1994 and granted on May 19, 1998.

This cited prior art patent protects a technique to form an un-doped silicon-based laminated structure having a reduced mechanical stress. As shown in FIG. 8, this low-stress un-doped laminated structure 30 could be deposited (respectively in order, from the underlying sacrificial layer to the top surface) using a first high-temperature compressive stress un-doped polysilicon 23, a first 0.1 to 3 nm thick auxiliary $SiO_2$ layer 24 (produced, for example, by a waiting time at atmosphere), a second low-temperature tensile stress un-doped amorphous silicon 25, a second 0.1 to 3 nm thick auxiliary $SiO_2$ layer 26, a third high-temperature compressive stress un-doped polysilicon 27, a third 0.1 to 3 nm thick auxiliary $SiO_2$ layer 28 and a fourth low-temperature tensile stress amorphous un-doped silicon 29. The auxiliary $SiO_2$ layers 24, 26, 28 assure that no epitaxial growth occurs when growing the un-doped amorphous silicon over the un-doped polysilicon.

This cited prior art patent discloses that the un-doped layers 23, 25, 27, 29, of individual thickness ranging between 50 nm and 1 μm, have to be implanted and high-temperature activated using rapid thermal activation, RTA, at approximately 1000° C. after the deposition of the corresponding layers as to reduce the electrical resistance of the laminated structure 30. Following these four RTA, the second amorphous un-doped silicon layer 25 and the fourth amorphous un-doped silicon layer 29 are converted into doped polycrystalline silicon, similar to doped polysilicon layers 23 and 27. To ensure that the laminated structure 30 has a sheet resistance corresponding to a single doped polysilicon layer having the same thickness, these four implantations and four high-temperature RTA steps should break up the auxiliary $SiO_2$ layers 24, 26, 28. Again, the required four RTA steps at a temperature of about 1000° C. is too restrictive and do not allow MEMS integration AFTER the integrated circuit.

Case Western Reserve University's Low-Stress Layered Polysilicon Structures

A fifth example of a technique used to reduce the stress-relief temperature of silicon films is provided by the following publications from Case Western Reserve University: Arthur H. Heuer, Harold Kahn and Jie Yang, U.S. Pat. No. 6,268,068, "Low stress polysilicon film and method for producing same", Case Western Reserve University, filed on Mar. 1, 1999 and granted on Jul. 31, 2001; Arthur H. Heuer, Harold Kahn and Jie Yang, U.S. Pat. No. 6,465,045, "Low stress polysilicon film and method for producing same", Case Western Reserve University, filed on Oct. 18, 2000 and granted on Oct. 15, 2002; Arthur H. Heuer, Harold Kahn, Jie Yang and Stephen M. Phillips, U.S. Pat. No. 6,479,166, "Large area polysilicon films with predetermined stress characteristics and method for producing same", Case Western Reserve University, filed on May 1, 2000 and granted on Nov. 12, 2002; Jie Yang, Harold Kahn, An-Qiang He, Stephen M. Phillips and Arthur H. Heuer, "A new technique for producing large-area as-deposited zero-stress LPCVD polysilicon films: The multipoly process", IEEE Journal of microelectromechanical systems, Vol. 9, No. 4, December 2000, pp. 485–494.

These three cited prior art patents and this publication describe a technique similar to the upper-cited Siemens Aktiengesellschaft's patent resulting in the fabrication of low-stress laminated structures involving sequential combinations of low-temperature (570° C. or lower) tensile stress amorphous (or devitrified) un-doped silicon layers and of high-temperature (615° C.) compressive stress un-doped polysilicon layers. In this case, though, the $SiO_2$ auxiliary layers are not used as to prevent the interaction of upper amorphous (or devitrified) un-doped layers with underlying un-doped polysilicon layers. In fact, this cited prior-art technique integrates all layers in a single deposition run, without atmospheric exposure.

As seen in FIG. 9, an example of such low-stress laminated structure combining tensile stress (about +200 MPa) un-doped amorphous silicon layers and compressive stress (about −200 MPa) un-doped polysilicon layers is a 3.0 μm thick laminated structure having an overall tensile mechanical stress of only 7 MPa using the following nine (9) layers:

a. A 59 minutes deposition of a devitrified un-doped polysilicon layer at 570° C. followed by a 25 minutes heating to reach 615° C.;
b. A 54 minutes deposition of a columnar un-doped polysilicon layer at 615° C. followed by a 30 minutes cooling to 570° C.;
c. A 118 minutes deposition of a devitrified un-doped polysilicon layer at 570° C. followed by a 25 minutes heating to reach 615° C.;
d. A 54 minutes deposition of a columnar un-doped polysilicon layer at 615° C. followed by a 30 minutes cooling to 570° C.;
e. A 118 minutes deposition of a devitrified un-doped polysilicon layer at 570° C. followed by a 25 minutes heating to reach 615° C.;
f. A 54 minutes deposition of a columnar un-doped polysilicon layer at 615° C. followed by a 30 minutes cooling to 570° C.;
g. A 118 minutes deposition of a devitrified un-doped polysilicon layer at 570° C. followed by a 25 minutes heating to reach 615° C.;
h. A 54 minutes deposition of a columnar un-doped polysilicon layer at 615° C. followed by a 30 minutes cooling to 570° C.;
i. A 59 minutes deposition of a devitrified un-doped polysilicon layer at 570° C.

This cited prior art patent indicates that the 59 minutes duration deposition of the first and ninth un-doped layers (one-half the deposition time for each of un-doped layers 3, 5, and 7) provides a low residual stress and a relatively smooth outer finish. Again, the laminated structure of this cited prior art patent has to be implanted and high-temperature activated using either RTA or furnace activation at approximately 1000° C. and for a duration sufficiently long as to uniformly dope and reduce the electrical resistance of the obtained 3 μm thick laminated structure. Following this high-temperature dopant activation, the first, third, fifth, seventh and ninth devitrified un-doped silicon layers will be converted into doped polycrystalline silicon, similar to the second, fourth, sixth and eight doped polysilicon layers. This required RTA or furnace activation at a temperature of about 1000° C. is again too restrictive and do not allow MEMS integration AFTER the integrated circuit.

UC Berkeley's Low-Stress Re-Crystallized In-Situ Doped Polysilicon

A sixth example of a technique used to reduce the stress-relief temperature of silicon films is provided by the following publications from UC Berkeley: James M.

Bustillo, Roger T. Howe and Richard S. Muller, "Surface Micromachining for Microelectromechanical Systems", Proceedings of the IEEE, Vol. 86, No. 8, August 1998; Jocelyn Tsekan Nee, "Hybrid surface-/bulk micromachining processes for scanning micro-optical components", Ph.D. thesis, UC Berkeley, Fall 2001.

A low-stress re-crystallized in-situ doped polysilicon has been investigated at UC Berkeley. By using a deposition temperature of 585–590° C., an in-situ doped low-resistivity polysilicon can be deposited at a relatively rapid rate. As shown in FIG. 10, this as-deposited low-resistivity phosphorus-doped polysilicon obtained at such 585–590° C. temperature suffers from crystallographic inhomogeneity observed as polysilicon grains near the underlying oxide interface which progressively disappear toward the upper surface. This non-homogeneous crystalline structure results in a stress gradient and requires a short duration 950° C. rapid-thermal annealing (RTA) to be performed as to achieve a low tensile stress with negligible stress gradient throughout the film thickness. Because the short duration 950° C. RTA replaces typically longer duration and higher temperature furnace anneals, this technique is slightly better then the upper-discussed techniques but still have a thermal budget which makes the MEMS AFTER the integrated circuit approach unfeasible because the interconnect materials will not resist such a high-temperature stress-relief.

Summary of the Restrictive High-Temperature Stress-Relief Processes Associated with the Cited Prior Art The processes described in the upper prior art documents cannot allow the fabrication of advanced MEMS devices after the integrated circuit because of their excessive high-temperature stress-relief.

Analog Devices' Modular MEMS process requires the CMOS devices to be fabricated in a thick polished (using CMP) selective epitaxial silicon layer AFTER the mechanical parts are fabricated. In that case, the epitaxial silicon deposition at a temperature of about 1000–1200° C. and the well diffusions of the integrated circuit allow the stress relief of the structural polysilicon.

Samsung Advanced Institute of Technology's MEMS process also requires the CMOS devices to be fabricated after the mechanical parts. In this case, the 16 hours duration 1200° C. drive-in diffusion of the p-well implant of the integrated circuit is used as stress-relief of the microstructural polysilicon.

Sandia National Laboratories' IMEMS process also requires the CMOS, bipolar or BiCMOS devices to be fabricated after the mechanical parts. Again, a high-temperature stress-relief at temperatures of the order of 1000° C. is performed after the mechanical parts prior fabricating the integrated circuit as to ensure that the subsequent thermal budget required integrated circuit processing will not affect the mechanical properties of the mechanical parts.

MEMSCAP's Polysilicon Multi-User MEMS (PolyMUMPs) process requires three successive (1 hour each) 1050° C. exposures to dope and stress-relief the three layers of polysilicon doped by the phosphorus diffusing from the neighboring phosphosilicate layers. Again, any tentative of integrating CMOS devices to the MUMPs process would require the integrated circuit to be fabricated after the mechanical parts as to prevent the destruction of the junctions during these three 1050° C. exposures.

Robert Bosch GmbH's surface micromachining process requires two high-temperature exposures: A first one, at 1000° C. in an oxygen ambient, to drive and activate the Sb dopant of a first polysilicon layer; and a second one, at about 1100° C., for the deposition of the second structural epipoly layer. Again, this process requires the integrated circuit to be fabricated after the mechanical parts as to prevent the destruction of the junctions during such restrictive heat treatments.

Sandia National Laboratories' CMOS-first, micromechanics-last MEMS process decribes the fabrication the CMOS devices before the mechanical parts but still requires a very restrictive 3 hours duration and 1100° C. stress-relief of the structural polysilicon following the integrated circuit fabrication. To enhance the thermal stability of the integrated circuit, aluminum interconnects are completely replaced by 1.0 μm thick low-stress tungsten interconnects deposited by chemical vapor deposition, CVD over a titanium nitride, TiN, barrier layer. The process is yet unstable because of various issues related to: tungsten delamination and lifting at bond pads, tungsten surface roughness imposing manual photolithography, TiN barrier layer failure during the 3 hours, 1100° C. stress-relieve and boron out-diffusion during the 3 hours, 1100° C. stress-relief. These limitations caused Sandia to drop this idea and look for other approaches besides the all-tungsten, CMOS-first, micromechanics-last MEMS process.

University of Michigan's process describes the deposition of a low-stress un-doped polysilicon at a temperature of about 588–610° C. followed by the diffusion and activation at 950° C.–1050° C. (for one to a few hours in nitrogen) of a phosphorus implantation at an energy of 50 keV–100 keV and a dose of about $7E15/cm^2$–$2E16/cm^2$ as to increase the electrical conductivity of the deposited polysilicon and reduce its mechanical stress to about 25 MPa. Again, the required 950° C.–1050° C. diffusion and activation of the phosphorus implantation again forces the integrated circuit to be fabricated AFTER the MEMS process as to prevent the destruction of the junctions during such restrictive heat treatments.

UC Berkeley's low-stress un-doped porous polysilicon process describes an un-doped low residual stress porous polysilicon deposited at 597° C.–605° C. under special conditions which requires its doping and activation at a high-temperature ranging between 950° C. and 1050° C. as to achieve low-stress conductive permeable polysilicon material. Again, the required 950° C.–1050° C. diffusion and activation of the low residual stress porous polysilicon again forces the integrated circuit to be fabricated AFTER the MEMS process as to prevent the destruction of the junctions during such restrictive heat treatments.

U. of Wisconsin's low-stress re-crystallized polysilicon process describes the 591° C. deposition of a 2.0 μm thick 300 MPa compressive stress un-doped silicon film having two phases: A bottom un-doped polycrystalline phase and an upper un-doped amorphous phase. A post-deposition stress relief at a temperature below 835° C. allows this film to be converted to a re-crystallized un-doped film with a tensile stress of as low as 20 MPa. The post-deposition diffusion and activation of these un-doped re-crystallized films at a temperature between 950° C.–1050° C. again forces the integrated circuit to be fabricated after the MEMS process as to prevent the destruction of the junctions during such restrictive heat treatments.

Siemens Aktiengesellschaft's low-stress layered polysilicon process describes a technique to form an low mechanical stress un-doped silicon-based laminated structure using a first high-temperature compressive stress un-doped polysilicon, a first auxiliary $SiO_2$ layer, a second low-temperature tensile stress un-doped amorphous silicon, a second auxiliary $SiO_2$ layer, a third high-temperature compressive stress un-doped polysilicon, a third auxiliary $SiO_2$ layer and a fourth low-temperature tensile stress amorphous un-doped silicon. Again, post-deposition diffusions and activations of these laminated un-doped layers by four independent rapid thermal activations, RTA, at approximately 1000° C. again force the integrated circuit to be fabricated AFTER the MEMS process as to prevent the destruction of the junctions during such restrictive heat treatments.

Case Western Reserve University's low-stress layered polysilicon process describes the fabrication of a 3.0 μm thick low tensile stress (+7 MPa) laminated structures involving the sequential combination of five low-temperature (570° C. or lower) +200 MPa tensile stress amorphous (or devitrified) un-doped silicon layers and of four high-temperature (615° C.) −200 MPa compressive stress un-doped polysilicon layers with no auxiliary $SiO_2$ layers in a single deposition run, without atmospheric exposure. Again, the post-deposition diffusion and activation of this un-doped laminated structure by RTA or furnace activation at approximately 1000° C. for a duration sufficiently long as to uniformly dope and reduce the electrical resistance of the obtained 3 μm thick laminated structure again forces the integrated circuit to be fabricated AFTER the MEMS process as to prevent the destruction of the junctions during such restrictive heat treatments.

UC Berkeley's low-stress re-crystallized in-situ doped polysilicon process describes a low-stress re-crystallized in-situ doped polysilicon deposited at a temperature of about 585–590° C. at a relatively rapid rate providing a film with a crystallographic inhomogeneity observed as polysilicon grains near the underlying oxide interface which progressively disappear toward the upper surface. This non-homogeneous crystalline structure results in a stress gradient and requires a short duration 950° C. RTA to achieve a low tensile stress with negligible stress gradient throughout the film thickness. Again, the short 950° C. RTA of the non-homogeneous crystalline structure forces the integrated circuit to be fabricated after the MEMS process as to prevent the destruction of the junctions and the interconnects during such restrictive heat treatments.

None of the cited prior art references described a process which can allow the effective fabrication of advanced MEMS devices after the integrated circuit because to each of these are associated an excessive high-temperature treatment to stress-relief, dope or activate the dopants of the deposited silicon.

SUMMARY OF THE INVENTION

The present invention discloses an improved technique allowing the fabrication of advanced MEMS after the integrated circuit. This technique eliminates the excessive high-temperature treatment to stress-relief, dope or activates the dopants of the deposited silicon avoids the use of CMP and allows advanced integrated circuits to be fabricated before the mechanical parts According to the present invention there is provided a method fabricating a micro-electro-mechanical (MEM) device and an electronic device on a common substrate comprising the steps of fabricating an electronic device comprising a plurality of electronic components on said common substrate; depositing a thermally stable interconnect layer on said electronic device; encapsulating the interconnected electronic device with a protective layer; forming a sacrificial layer over said protective layer; opening holes in the sacrificial layer and said protective layer to allow the connection of the MEM device to said electronic device; fabricating said MEM device by depositing and patterning at least one layer of amorphous silicon; and removing at least a portion of said sacrificial layer.

The interconnect layer may involve only one level of interconnections, or alternatively it may two, three, four, or more than four levels of interconnections.

There can, for example, be one, two, three, four, five or more than five layers of amorphous silicon.

The MEM device can, for example, be a photonics MEM device; a bioMEM device; an RF MEM device; an automotive MEM device; an industrial MEM device; a spatial MEM device; a military MEM device; a MEM device fabricated, at least partially, by surface micro-machining; or a MEM device fabricated, at least partially, by bulk micro-machining.

The at least one amorphous silicon layer is deposited at a temperature of less than 580° C., preferably less than 570° C., preferably less than 560° C., and more preferably between 520 and 550° C.

The at least one layer of amorphous silicon is preferably deposited using silane at a partial pressure of less than 5000 mTorr, preferably less than 2000 mTorr, preferably less than 1000 mTorr; preferably less than 750 mTorr; preferably less than than 500 mTorr; and most preferably between 100 and 500 mTorr.

The at least one layer of amorphous silicon may be phosphorus-doped using a phosphine partial pressure of less than 5 mTorr, preferably less than 2 mTorr; preferably less than 1 mTorr; preferably less than 0.75 mTorr; preferably less than 0.50 mTorr; and preferably between 0.10 and 0.50 mTorr.

The at least one layer of amorphous silicon may be phosphorus-doped to provide a bulk resistivity of less than 1000 mohm·cm; less than 100 mohm·cm; less than 10 mohm·cm; less than 5 mohm·cm; less than 2 mohm·cm; less than 1 mohm·cm, or between 0.1 and 1 mohm·cm.

The at least one layer of amorphous silicon may be un-doped and have a compressive mechanical stress of less than −400 MPa; less than −300 MPa; less than −200 MPa; less than −100 MPa; less than −50 MPa; less than −20 MPa; less than −10 MPa; or between −0.01 MPa and −10 MPa.

Alternatively, the at least one layer of amorphous silicon is phosphorus-doped and has a tensile mechanical stress of less than +400 MPa; less than +300 MPa; less than +200 MPa; less than +100 MPa; less than +50 MPa; less than +20 MPa; less than +10 MPa, or between +0.01 MPa and +10 MPa.

The at least one layer of amorphous silicon may be slightly phosphorus-doped and have a low residual mechanical stress of less than −100 MPa; less than −50 MPa; less than −20 MPa; less than −10 MPa; between −0.01 MPa and −10 MPa; between +0.01 MPa and +10 MPa; less than +10 MPa; less than +20 MPa; less than +50 MPa; or less than +100 MP.

In one embodiment several said layers of amorphous silicon form a laminated structure combining un-doped and phosphorus-doped layers. The laminated structure has a low residual mechanical stress of less than −100 MPa; less than than −50 MPa; less than −20 MPa; less than −10 MPa; between −0.01 MPa and −10 MPa; between +0.01 MPa and +10 MPa; less than +10 MPa; less than +20 MPa; less than +50 MPa; or less than +100 MPa.

In another embodiment the at least one layer of amorphous silicon is un-doped and has an absolute stress gradient of less than 20 MPa/μm; less than 10 MPa/μm; less than 5 MPa/μm; less than 3 MPa/μm; less than 2 MPa/μm; less than 1 MPa/μm; or between 0.1 MPa/μm and 1 MPa/μm;

Alternatively, the at least one layer of amorphous silicon can be phosphorus-doped and have an absolute stress gradient of less than 20 MPa/μm; less than 10 MPa/μm; less than 5 MPa/μm; less than 3 MPa/μm; less than 2 MPa/μm; less than 1 MPa/μm; or between 0.1 MPa/μm and 1 MPa/μm.

In another embodiment the at least one layer of amorphous silicon is slightly phosphorus-doped and has a low absolute stress gradient of less than 5 MPa/μm; less than 3 MPa/μm; less than 2 MPa/μm; less than 1 MPa/μm; or between 0.1 MPa/μm and 1 MPa/μm.

The amorphous silicon can comprise several layers forming a laminated structure combining un-doped and phosphorus-doped layers, the laminated having a low absolute stress gradient of less than 5 MPa/μm; less than 3 MPa/μm; less than 2 MPa/μm; less than 1 MPa/μm; between 0.1 MPa/μm and 1 MPa/μm.

Unlike the prior art, the present invention can produce at a temperature compatible with an underlying integrated circuit an electrically conductive and low mechanical stress and stress gradient laminated structure in a single integrated cycle in a low-temperature reactor without the need for air exposures, without the need for interfacial auxiliary oxide layers, without the need for dopant implantation, without the need for high temperature dopant diffusion and/or activation in a furnace or a rapid thermal processor in order to produce by surface micro-machining over a previously fabricated integrated circuit incorporating CMOS, bipolar, Bi-CMOS and/or high-voltage devices the electrically conductive low-stress mechanical structures allowing the mechanical functions of the integrated MEMS device over its control electronics.

This integration of modular MEMS devices directly over a previously fabricated integrated circuit is possible because the maximum exposure temperature of 550° C. is now compatible with tungsten-filled contacts and its underlying high quality titanium nitride barrier/glue layer. More, the integration of these modular MEMS devices over an integrated circuit benefit from its smooth surface topology profile and eliminate the complex processing related to the alternate approach requiring extensive planarization of the thick structures composing the MEMS devices as to allow precision photolithography to be performed with modern exposure equipment having small depth of focus.

Mooreover, the modular approach of the present invention allows a very wide variety of MEMS devices to be essentially "dropped" onto conventional CMOS and high-voltage CMOS devices as to produce intelligent Microsystems in various application markets such as: RF telecommunications (RF MEMS and such) and optical communications (Photonics MEMS), biomedical and medicine (biochips, lab-on-a-chip and such), automotive (pressure sensors, inertial sensors and such), information technology (printer heads, magnetic components for hard disks, and such), industrial (gas sensors and such). In fact, this new possibility of combining micro-mechanics with existing micro-electronics devices opens so much new opportunities that these are simply impossible to list.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 11:
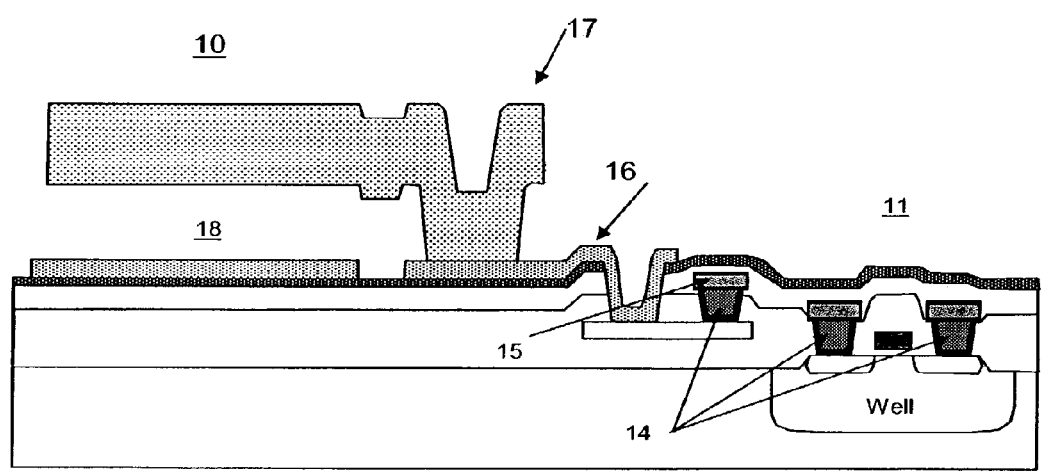
FIG. 11 illustrates a strategy allowing the fabrication of advanced MEMS after the integrated circuit in accordance with one embodiment of the invention.

The process allowing the fabrication of advanced MEMS devices after the integrated circuit is shown in FIG. 11. This process requires the mechanical parts of the MEMS device to be fabricated over the interconnections of the integrated circuit, thus imposing an upper limit on the process temperature of about 550° C., the maximum temperature at which aluminium interconnections can be exposed.

The MEMS device shown in FIG. 11 has a mechanical MEMS part 10 and an integrated circuit part 11. These are formed on a silicon substrate 12 having a well 13 with tungsten plugs 14 over Ti/TiN at the contacts. A TiN/Al/TiN layer 15 provides the interconnects.

A protective silicon layer 16 interconnects the integrated circuit 11 and MEMS device 10, which is made out of structural silicon layers 17 over a region 18 where sacrificial material has been removed.

Figure 12:
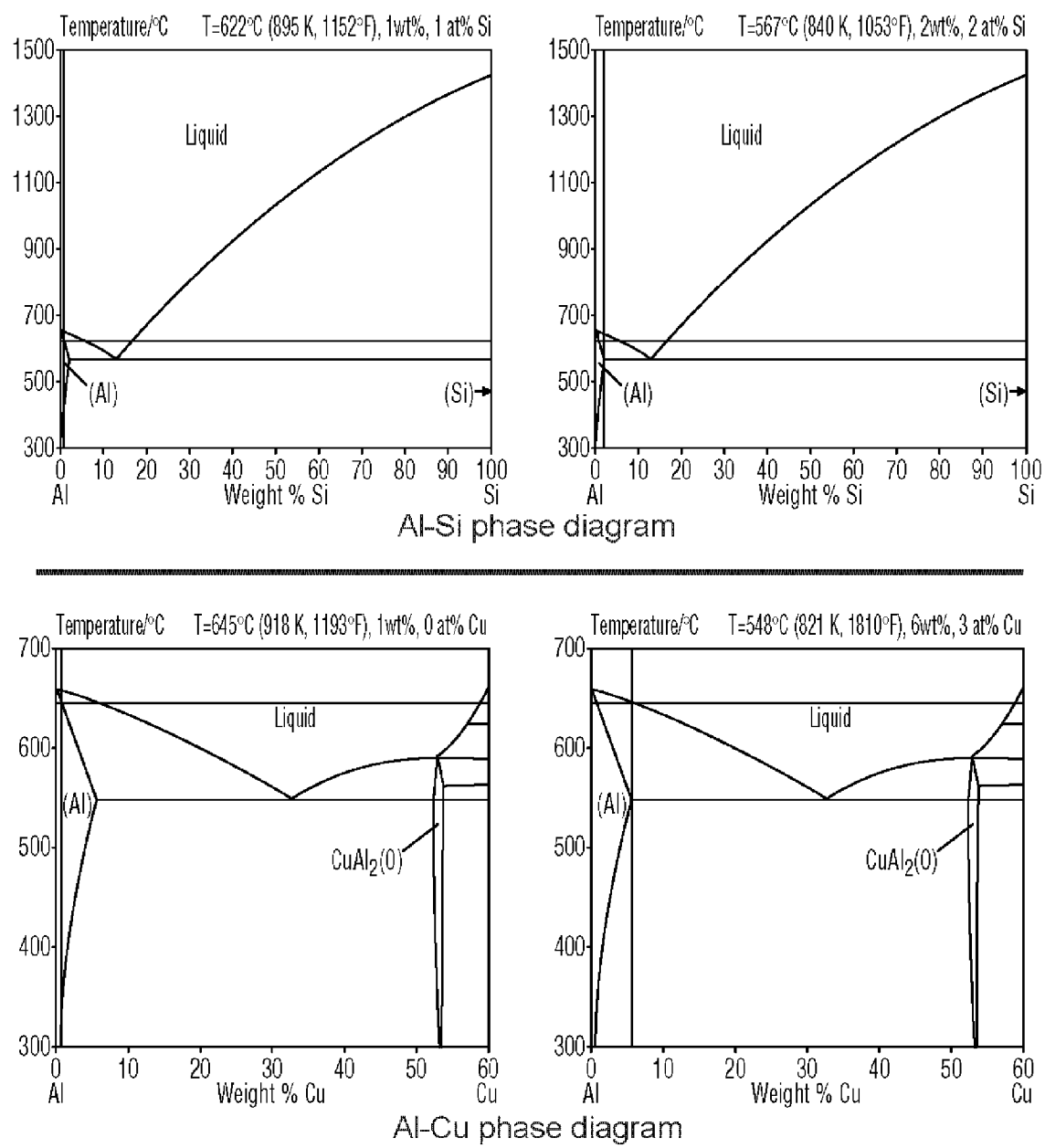
FIG. 12 shows Al—Si and Al—Cu phase diagrams.

The maximum temperature at which typical Al—Si binary alloy, Al—Cu binary alloy or Al—Si—Cu ternary alloy interconnections can be exposed is largely dependant upon the eutectic temperature of these aluminium alloys. The aluminium-rich side of the Al—Si and Al—Cu phase diagram are shown on FIG. 12. The aluminium-rich side of the Al—Si—Cu phase diagram is built from the aluminium-rich side of the individual Al—Si, Al—Cu phase diagrams. It is clear from FIG. 12 that aluminium can dissolve the silicon of a binary Al-1 wt % Si alloy and be exposed to a temperature as high as 622° C. before any eutectic formation while the silicon of a binary Al-2 wt % Si would provoke the formation of a eutectic when exposed to a temperature as low as 567° C. Similarly, aluminium can dissolve the copper of a binary Al-1 wt % Cu alloy and be exposed to a temperature as high as 645° C. before any eutectic formation while the copper of a binary Al-6 wt % Cu would provoke the formation of a eutectic when exposed to a temperature as low as 548° C. Combining these results, it is anticipated that aluminium could dissolve the silicon and the copper of a ternary Al-1 wt % Si-1 wt % Cu alloy and be exposed to a temperature as high as 622° C. before any Al—Si eutectic formation.

The fabrication of integrated circuits with similar aluminium alloys exposed to temperatures exceeding 550° C. has been described by Samsung Electronics Co. Ltd. And has been used in the fabrication of their 4 Mb and 16 Mb DRAM devices: Sang-in Lee, Chang-soo Park and Jeong-ha Son, U.S. Pat. No. 5,266,521, "Method for forming a planarized composite metal layer in a semiconductor device", Samsung Electronics Co. Ltd., filed on Jan. 31, 1992 and granted on Nov. 30, 1993;

Youngjin Wee, In-seon Park and Sang-in Lee, U.S. Pat. No. 5,814,556, "Method of filling a contact hole in a semiconductor substrate with a metal", Samsung Electronics Co. Ltd., filed on Aug. 15, 1996 and granted on Sep. 29, 1998; Sang-in Lee, Jeong-in Hong, Jong-ho Park and U.S. Pat. No. 5,843,842, "Method for manufacturing a semiconductor device having a wiring layer without producing silicon precipitates", Samsung Electronics Co. Ltd., filed on Sep. 3, 1996 and granted on Dec. 1, 1998; Integrated Circuit Engineering, Construction analysis report number SCA 9311-3001, "Samsung KM44C4000J-7 16 megabit DRAM", March 1995, 52 pages.

Figure 13:
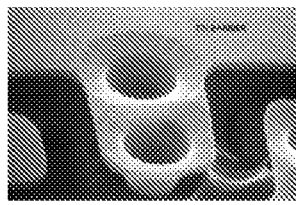
FIG. 13 illustrates Samsung's 16 Mb DRAM using a high-temperature aluminium reflow technique.
Figure 13:
Figure 13:
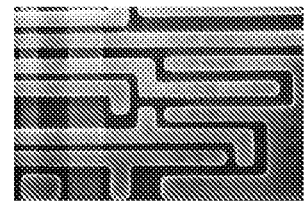
Figure 13:
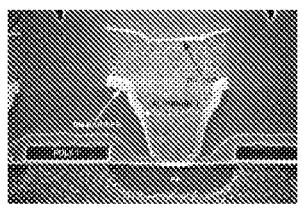
Figure 13:
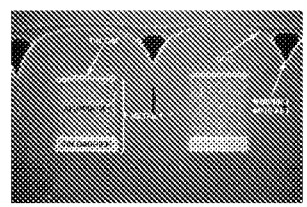
Figure 13:
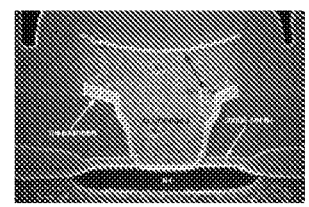
Figure 13:
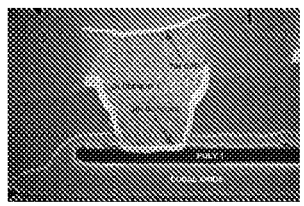
Figure 13:
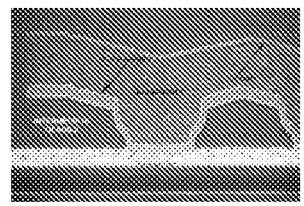
Figure 13:
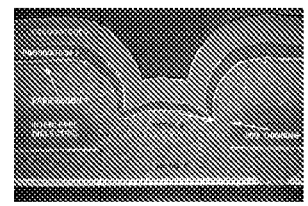
Figure 13:
Figure 13:
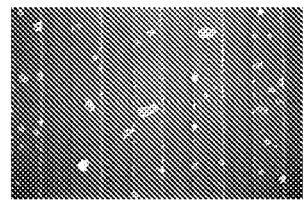
Figure 13:
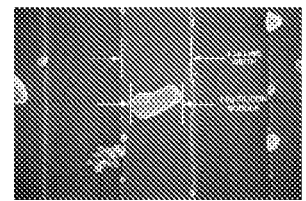

FIG. 13 shows some pictures taken from the ICE's Construction analysis report of Samsung's 16 Mb DRAM and clearly demonstrate that this 16 Mb DRAM device used the upper disclosed high-temperature aluminium reflow technique. The two levels of interconnects are the following:
 a. A first metal, composed of a 0.15 µm thick TiN barrier, a reflowed 0.55 µm thick aluminium alloy and a 0.04 µm thick TiN anti-reflective (cap) layer;
 b. A second metal, composed of a non-reflowed 0.9 µm thick silicon-containing aluminium alloy.

As described in their U.S. Pat. Nos. 5,266,521, 5,814,556, Al-1 wt % Si, Al-0.5 wt % Cu or Al-1 wt % Si-0.5 wt % Cu alloys are heated for a few minutes at a temperature of 550° C. to provoke this the aluminium reflow. in the contacts to N+, P+, Poly 1 and Polycide regions and ensure a smooth and planarized top surface.

During these few minutes 550° C. aluminium reflow, the underlying TiN barrier layer prevents the underlying silicon material from being dissolved in the aluminium alloy, which would result in electrical shorts of the underlying N+ and P+ junctions. The resistance of the TiN barrier at such a high temperature can be improved by some techniques, such as the one described in the following USA patent: Luc Ouellet, Yves Tremblay and Luc Gendron, U.S. Pat. No. 6,127,266, "Stabilization of the interface between TiN and Al alloys", Mitel Corporation, filed on Nov. 26, 1997 and granted on Oct. 3, 2000; but it would still not resist very long exposures at such a high temperature, thus causing breakdown of the TiN barrier and junction leakage.

For this reason, the tungsten plug shown in FIG. 11 is used to contact N+, P+, Poly 1 and other underlying materials under the first level of interconnection of the integrated circuit. The tungsten-TiN interface is very resistant to prolonged exposures to very high temperatures.

Figure 14:
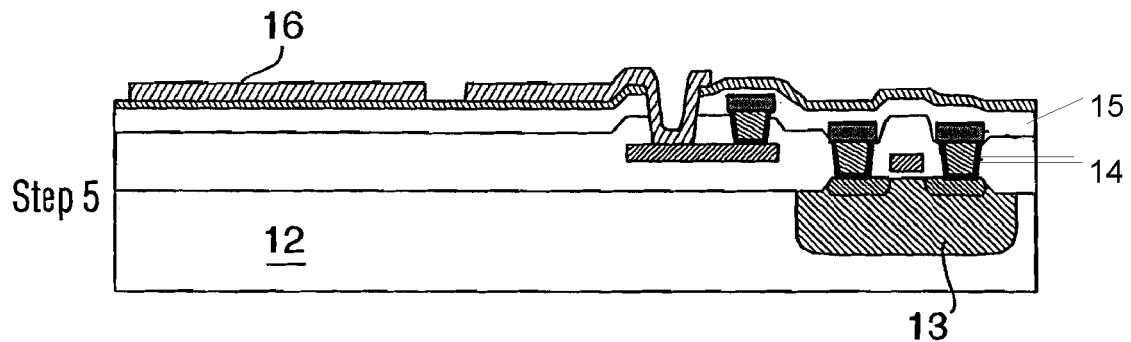
FIG. 14 illustrates an interconnection strategy allowing the fabrication of advanced MEMS after the integrated circuit in accordance with an embodiment of the invention.
Figure 14:
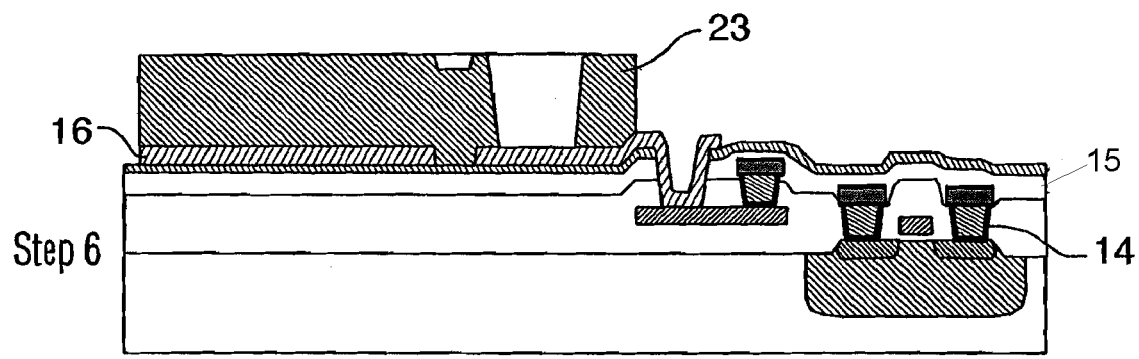
Figure 14:
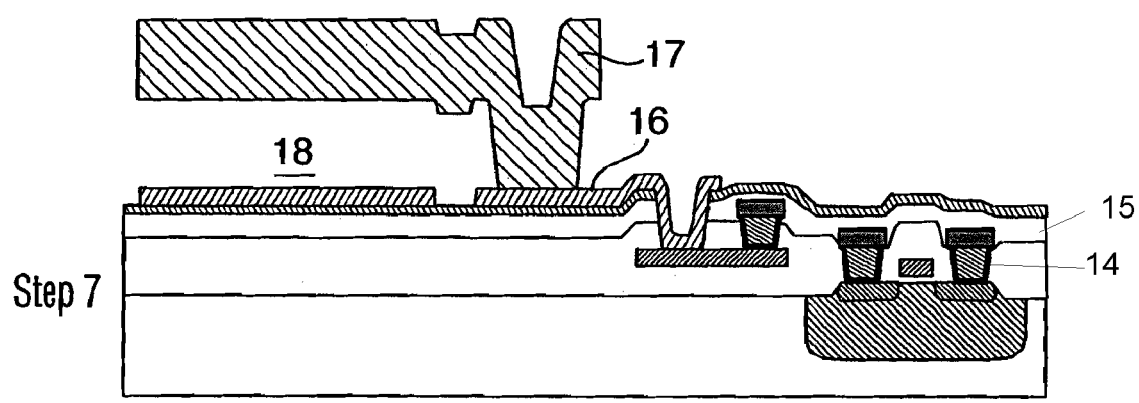

FIG. 14 shows the interconnection strategy allowing the fabrication of advanced MEMS after the integrated circuit. It involves the following steps:
 Step 1. A Ti/TiN contact layer is deposited on the active components to ensure low contact resistance to N+, P+, Poly 1 and other underlying materials.
 Step 2. A tungsten layer is deposited on the contact layer using chemical vapour deposition (CVD).
 Step 3. The CVD-W (tungsten) layer is etched back to leave tungsten plugs in the contact regions.
 Step 4. A TiN/AlSiCu/TiN interconnect layer 15 is deposited at high temperature over the tungsten plugs to form a low resistance interconnect.
 Step 5. A protective silicon layer 16 is deposited over the interconnect layer 15.
 Step 6. A sacrificial layer 23 is deposited over the protective layer 16.
 Step 7. The amorphous silicon layer 17 is deposited over the sacrificial layer 23 and patterned and the sacrificial layer 23 is removed to expose the region 18.

The TiN/AlSiCu/TiN interconnect layer is patterned to form a high temperature stability and low resistance interconnections over which a MEMS device can be fabricated at temperatures up to 550° C.

The interconnect layer should include a contact material incorporating a refractory material ensuring thermally stable contact resistance to N+ doped silicon, P+ doped silicon, and polysilicon. Alternatively, it can be titanium Ti; titanium-tungsten alloy, TiW; titanium nitride, TiN; titanium silicide, TiSi2; or a combination thereof.

The interconnect layer can also comprise a material such as aluminum; an aluminum-silicon binary alloy plug containing less then 2.0 wt % of silicon, as to ensure a silicon-eutectic temperature of more than 567° C.; an aluminum-copper binary alloy plug containing less than 6.0 wt % of copper to ensure a silicon-eutectic temperature of more than 548° C.; another binary aluminum alloy plug having an eutectic temperature higher than 545° C.; an aluminum-silicon-copper ternary alloy containing less than 2.0 wt % of silicon and less than 6.0 wt % of copper; a ternary aluminum alloy having an eutectic temperature higher than 545° C., Copper; Tungsten; a combination thereof.

The interconnect layer can be deposited by Physical vapor deposition, PVD; Chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; Electroplating; Electroless plating; a combinations thereof.

The interconnect layer preferably comprises a layered structure ensuring thermally stable interconnects, said layered interconnection structure comprising a titanium-based under-layer, an aluminum-based middle-layer, and a titanium-based over-layer. Preferably, the titanium-based under-layer is titanium, Ti, titanium nitride, TiN or combinations of Ti and TiN; the an aluminum-based middle-layer is aluminum, Al; an aluminum-silicon binary alloy containing less than 2.0 wt % of silicon, as to ensure a silicon-eutectic temperature of more than 567° C.; an aluminum-copper binary alloy containing less than 6.0 wt % of copper, as to ensure a silicon-eutectic temperature of more than 548° C.; a binary aluminum alloy having an eutectic temperature higher than 545° C.; an aluminum-silicon-copper ternary alloy containing less than 2.0 wt % of silicon and less than 6.0 wt % of copper; a ternary aluminum alloy having an eutectic temperature higher than 545° C. % of copper; a ternary aluminum alloy having an eutectic temperature 0o higher than 545° C.; and said titanium based over-layer is titanium, Ti, titanium nitride, TiN or combinations of Ti and TiN.

The contact material can be deposited by Physical vapor deposition, PVD; Reactive PVD; Chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; Rapid thermal processing, RTP; or a combination thereof.

Next a protective layer of undoped amorphous silicon (a-Si) is deposited over the interconnect layer.

Alternatively, the protective layer can be a titanium, Ti, layer; a titanium nitride, TiN, layer; an aluminum alloy layer; a plasma-enhanced chemical vapor deposited, PECVD, silicon nitride layer; a spin-on polymer; or a combination thereof.

The protective layer can be deposited by: Physical vapor deposition, PVD; Reactive PVD; Chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; Rapid thermal processing, RTP; or Combinations thereof.

Next, a sacrificial layer is deposited over the protective layer composed of: a silicate glass, SG, layer; a phosphorus-doped silicate glass, PSG, layer; a boron-doped silicate glass, BSG, layer; a boron- and phosphorus-doped silicate glass, BPSG, layer; a tetraethyl-ortho-silicate-glass, TEOS, layer; a fluorinated dielectric; a highly porous dielectric; a silicate spin-on glass, SOG, layer; a phosphorus-doped silicate SOG layer; or combinations thereof.

After opening holes in the sacrificial layer and the protective layer to allow connection of the MEM device to the electronic device, an amorphous silicon layer is deposited on the sacrificial layer and patterned. The sacrificial layer is then at least partially etched away to expose the MEM device.

The sacrificial layer can be etched away using concentrated (49%) hydrofluoric, HF, liquid acid; Concentrated (49%) hydrofluoric, HF, liquid acid, followed by anti-stiction chemicals exposure; Ammonium fluoride, $HN_4F$ buffered concentrated (49%) hydrofluoric, HF, liquid acid; Ammonium fluoride, $HN_4F$ buffered concentrated (49%) hydrofluoric, HF, liquid acid, followed by anti-stiction chemicals exposure; Water diluted hydrofluoric, HF, liquid acid; Water diluted hydrofluoric, HF, liquid acid, followed by anti-stiction chemicals exposure; Water diluted and ammonium fluoride, $HN_4F$ buffered diluted hydrofluoric, HF, liquid acid; Water diluted and ammonium fluoride, $HN_4F$ buffered diluted hydrofluoric, HF, liquid acid, followed by anti-stiction chemicals exposure; Vapor hydrofluoric, HF, liquid acid; Vapor hydrofluoric, HF, liquid acid, followed by anti-stiction chemicals exposure; Isotropic plasma removal; Isotropic plasma removal, followed by anti-stiction chemicals exposure; or combinations thereof.

The layer of amorphous silicon can be patterned using wet etching; plasma etching; Reactive ion etching, RIE; Deep reactive ion etching, DRIE; Combinations thereof.

The opening of the holes in the sacrificial layer and in the protective layer can permit the establishment of connections to circuit elements such as an N+ junction; a P+ junction; a polysilicon layer; an interconnection; or combinations thereof.

The opening of the holes can be performed by: wet etching; Plasma etching; Reactive ion etching, RIE; Deep reactive ion etching, DRIE; Combinations thereof.

The interconnection strategy described in FIG. 14 allows the fabrication of advanced MEMS after the integrated circuit as shown in FIG. 11. This interconnection strategy constitutes an important element of the present invention because it enables the integration of mechanical parts fabricated at a temperature of ranging between 530° C. and 550° C.

The strategy to produce low-stress doped silicon structures for the fabrication of advanced MEMS after the integrated circuit The strategy allowing the fabrication of low-stress doped silicon structures at temperatures ranging between 530° C. and 550° C. will now be described.

Introduction to In-Situ Doped Amorphous Silicon

Most MEMS fabrication facilities use post-deposition doping of low-stress polysilicon using high-temperature diffusion at temperatures ranging between 900° C. and 1000° C. for a few hours to achieve uniform doping through the thickness of a few microns thick low-stress structural polysilicon films. Unfortunately, these high temperature diffusions will destroy the integrated circuit fabricated in the wafer prior to polysilicon surface micromachining. As discussed above, if the diffusion/activation is performed for a shorter time, dopant distribution through the film thickness will not be uniform, resulting in difficulties with mechanical properties variations through the film thickness. Also, if the diffusion/activation is performed at lower temperature, dopant activation will not be adequate and excessively resistive polysilicon will result.

In one aspect, the invention describes a new way to use in-situ doped amorphous silicon films as to achieve low-temperature conductive laminated structures having low residual stress.

Polysilicon resistivity can be largely reduced by an in-situ doping during deposition by adding to silane some reaction gases such as phosphine (phosphorus n-type doping), arsine (arsenic n-type doping) or diborane (boron p-type doping), for example:

a. $SiH_4$ (gas to reach surface)→Si (silicon grows)+$2H_2$ (gas to eliminate from surface)

b. $PH_3$ (gas to reach surface)→P (in silicon)+$3/2H_2$ (gas to eliminate from surface)

c. $AsH_3$ (gas to reach surface)→As (in silicon)+$3/2H_2$ (gas to eliminate from surface)

d. $B_2H_6$ (gas to reach surface)→2B (in silicon)+$3H_2$ (gas to eliminate from surface)

Figure 15:
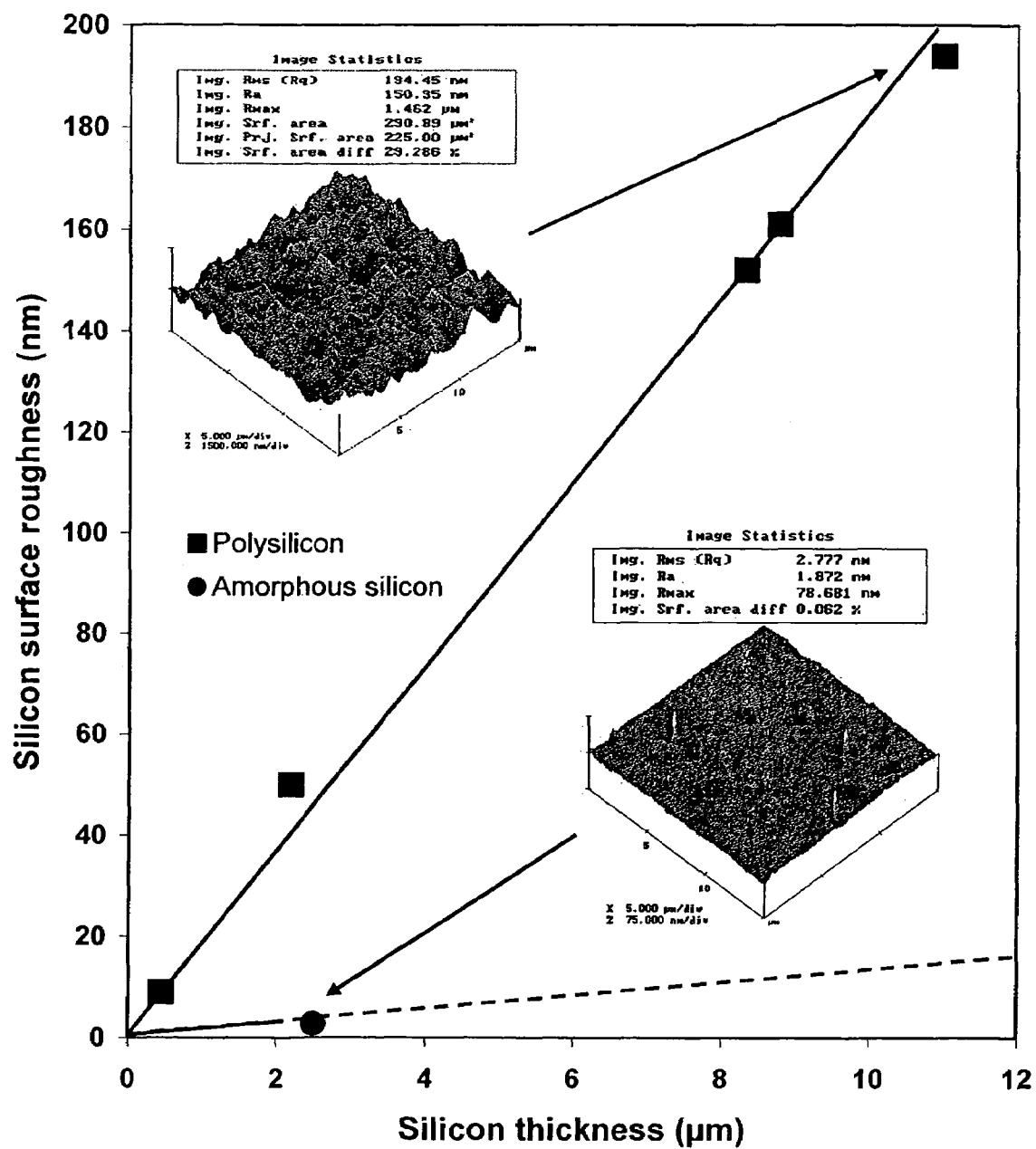
FIG. 15 shows atomic force microscopy measurements of the surface roughness of amorphous and polysilicon layers.

Deposition of in-situ doped silicon at temperatures ranging between 530° C. and 570° C. results in an in-situ doped amorphous silicon material with a very smooth surface finish. FIG. 15 shows the improved surface finish (measured by atomic force microscopy) associated with thick layers of amorphous silicon. Since most MEMS devices use very thick layers of structural material, the improved surface roughness associated with amorphous silicon is a major advantage since it allows the thick structural amorphous silicon to be finely patterned using advanced photolithography equipment.

The rate at which the in-situ doped silicon surface grows is function of various parameters. The clear understanding and absolute control of these growth parameters are necessary in order allow reproducible mechanical properties of the finely defined structural amorphous silicon.

The growth parameters of compressive mechanical stress un-doped amorphous silicon deposited at temperatures between 530° C. and 550° C.

The growth rate of an un-doped amorphous silicon characterized by the following silane pyrolisis reaction:

e. $SiH_4$ (gas to reach surface)→Si (silicon grows)+$2H_2$ (gas to eliminate from surface)

If the incoming rate of silane and the elimination rate of hydrogen are not limiting this pyrolisis reaction, the amorphous silicon growth rate should be reaction rate limited and should follow the following Arrhenius equation:

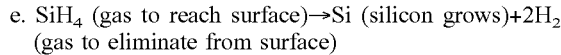

$$R = R_o \exp(-Ea/kT)$$

where Ea is silane's pyrolisis activation energy (eV), k is Boltzmann's constant and T is the temperature (K). Similarly, if the incoming rate of silane is too low (as to properly "feed" the growing surface in silicon atoms) and/or if the elimination rate of hydrogen is too low (as to cause a blocking effect limiting the pyrolisis reaction) then the amorphous silicon growth rate should be mass transport rate limited and should not reach the maximum growth rate predicted by the Arrhenius equation.

In order to ensure reproducible mechanical properties of un-doped amorphous silicon layers, it is very important to reach this maximum amorphous silicon growth rate characterized by this reaction rate limited situation because a very precise control of the growth temperature is possible in the pyrolisis reactor. The mass flow rate required to "properly feed" the growing surface is also dependent on the total surface consuming the silane and thus depends on the system's configuration such as the total number of exposed wafers to the chemical reaction.

Since amorphous silicon deposition performed at relatively lower temperatures (between 530° C. and 550° C.) it is expected that the deposition of amorphous silicon should be reaction rate limited.

This expectation can be easily verified at a given growth temperature by varying the flux of incoming silane on the surface (by varying the rate of incoming silane "feeding" the pyrolisis reaction via adjustments of the mass flow of silane incoming the pyrolisis equipment or, alternately, by varying the partial pressure of silane in equilibrium into the pyrolisis equipment via adjustments of the pumping rate at a given incoming rate of silane). If the pyrolisis reaction is rate limited, the growth rate would then be unaffected by these adjustments (i.e. there would be enough silane and not too much hydrogen to block the pyrolisis reaction) and the growth rate would be the maximum growth rate predicted by the Arrhenius equation for that growth temperature.

Figure 16:
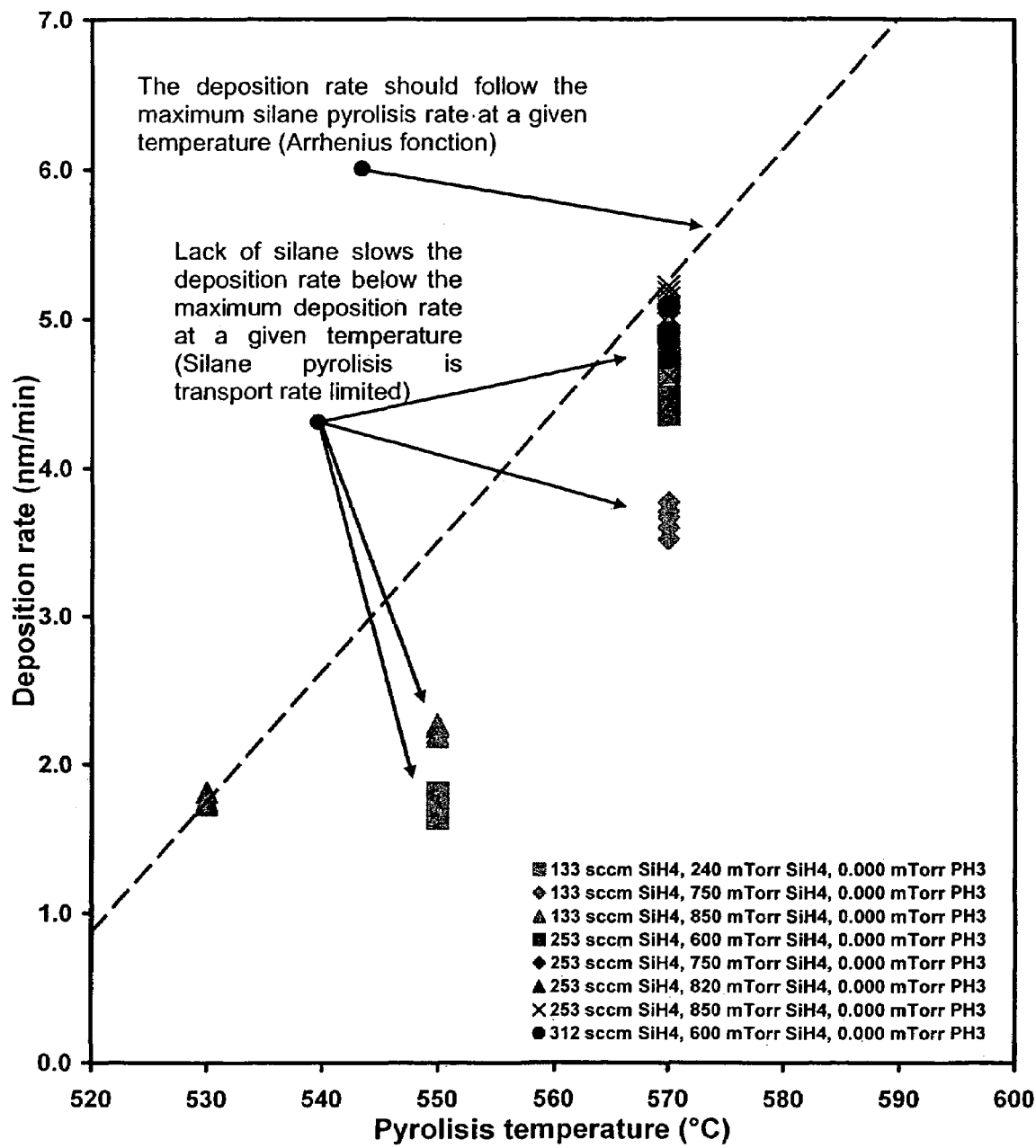
FIG. 16 shows the deposition of un-doped amorphous silicon using the pyrolisis of silane.

FIG. 16 shows that the pyrolisis of silane is in fact not reaction rate limited in most cases and that the lack of silane raw material at the surface slows the deposition rate below the maximum deposition rate at any given temperature. Silane pyrolisis is mass transport rate limited in most cases between 530° C. and 570° C.

Figure 17:
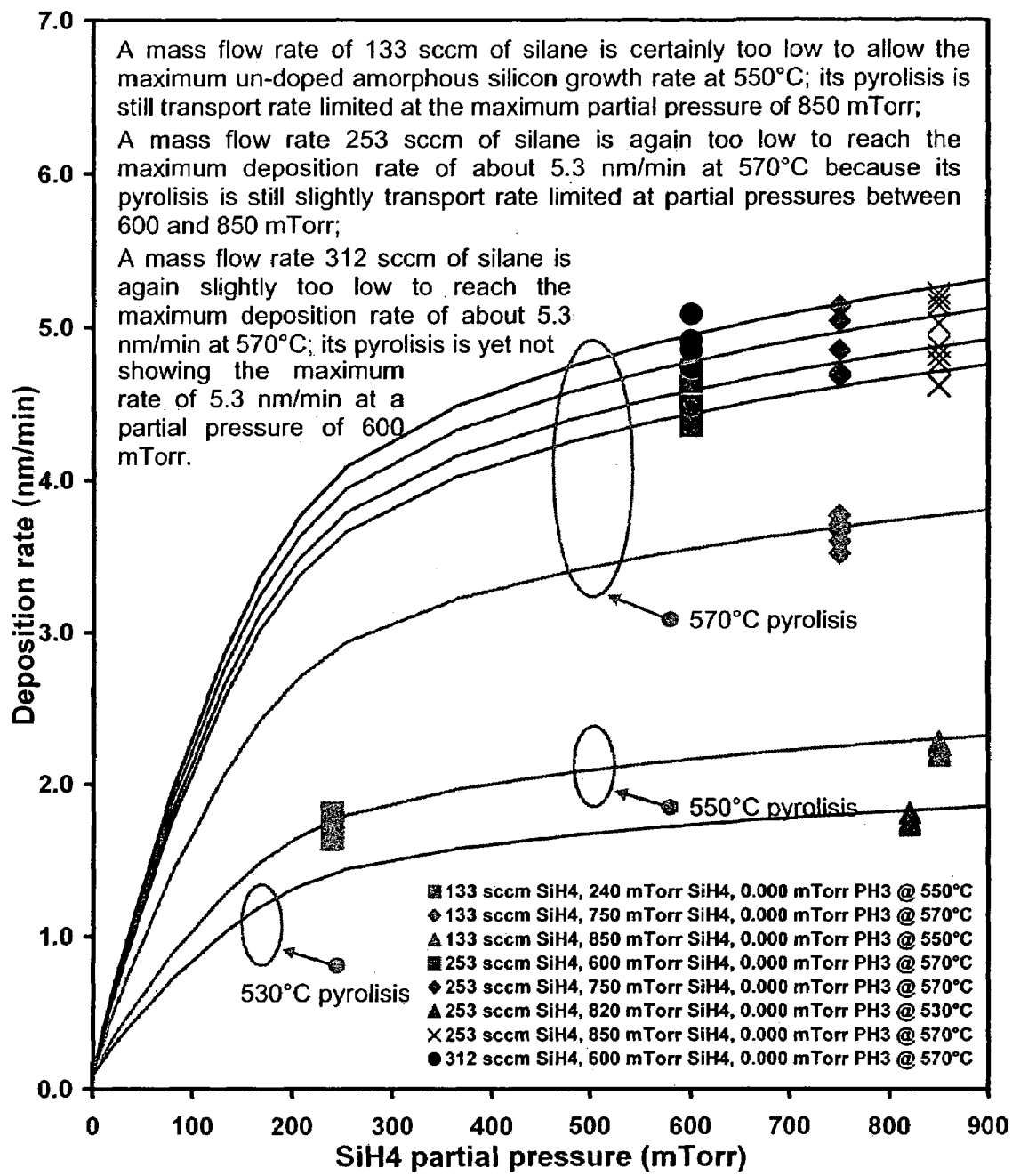
FIG. 17 shows the deposition of un-doped amorphous silicon using the pyrolisis of silane.

FIG. 17 also shows that the pyrolisis of silane at 550° C. is not reaction rate limited at a mass flow rate of 133 sccm and does not allow the maximum un-doped amorphous silicon growth rate of 3.4 nm/min @ 550° C. In fact, its pyrolisis is clearly transport rate limited at this mass flow rate of 133 sccm and at the maximum partial pressure of 850 mTorr. A mass flow rate 253 sccm of silane is also too low to reach the maximum deposition rate of about 5.3 nm/min at 570° C. and its pyrolisis is still mass transport rate limited at 570° C. and at partial pressures between 600 and 850 mTorr. A mass flow rate 312 sccm of silane is still slightly too low to reach the maximum deposition rate of about 5.3 nm/min at 570° C. and at a partial pressure of 600 mTorr.

In order to make sure that the mechanical properties of the grown un-doped amorphous silicon layers are repeatable, it is necessary to deposit these using a high enough silane mass flow rate to allow a reaction rate limited regime between 530° C. and 550° C. For our growth equipment, it is recommended to:

f. Increase the silane mass flow rate to reach the target growth rate of 1.7 nm/min @ 530° C. A silane mass flow rate of 253 sccm at 530° C. would certainly provide a reaction rate limited condition;

g. Increase the silane mass flow rate to reach the target growth rate of 3.4 nm/min @ 550° C. A silane mass flow rate of 253 sccm at 550° C. could be sufficient and could allow a reaction rate limited condition. A silane mass flow rate of about 350 to 400 sccm at 550° C. would be preferred to ensure a reaction rate limited condition.

Figure 18:
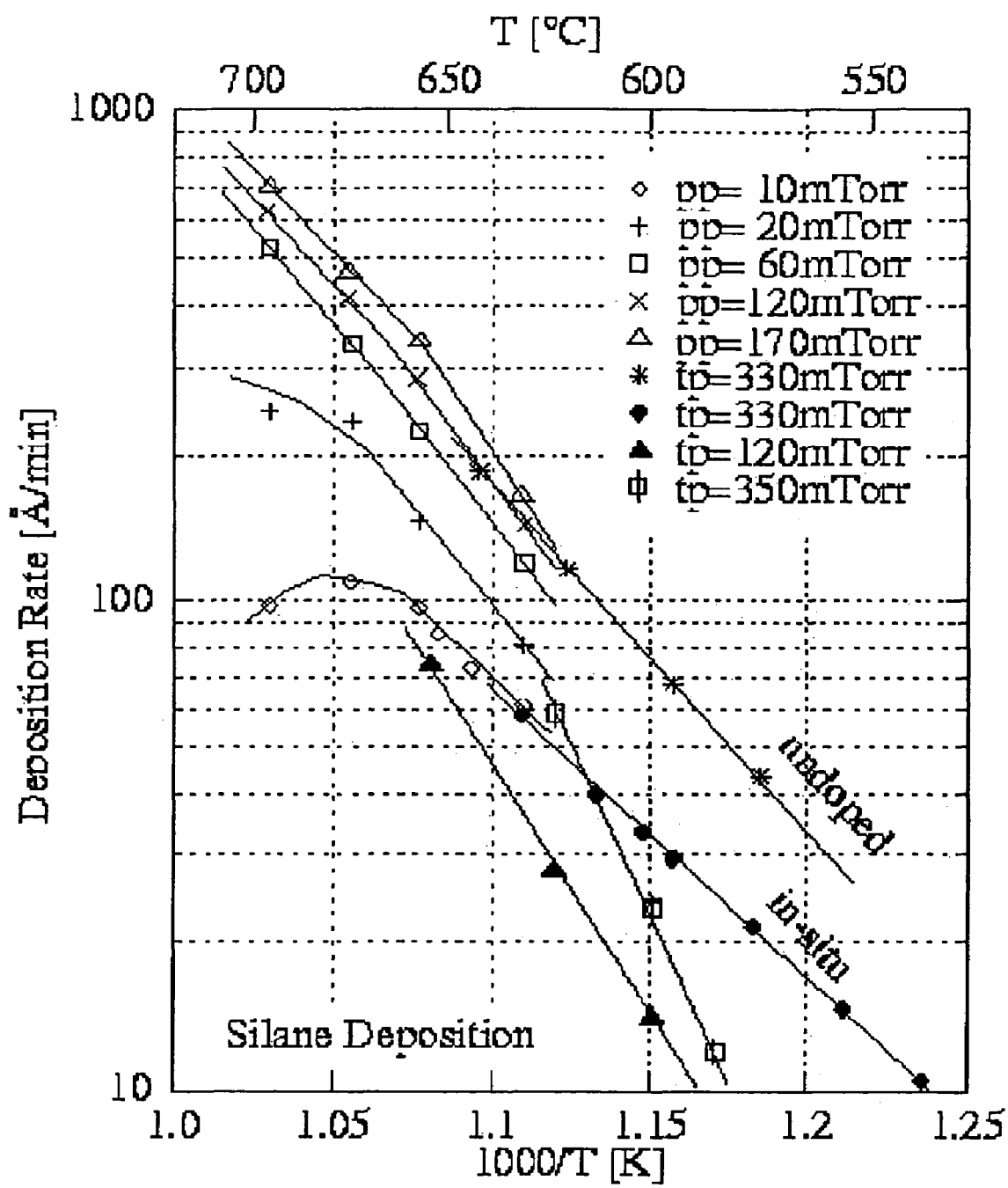
FIG. 18 shows the deposition rates of un-doped and in-situ doped amorphous silicon and polysilicon layers.

Depositing amorphous silicon under non-reaction rate limited conditions is very common in the literature. FIG. 18 shows the deposition rates of un-doped and in-situ doped amorphous silicon and polysilicon layers. The graph is taken from the following Ph.D. thesis: Helmut Puchner, "Advanced Process Modeling for VLSI Technology", Ph.D. thesis, Institute for microelectronics, Technical University of Vienna, June 1996.

It is from this FIG. 18 that most of the reported deposition rate of about 2.4 nm/min at 550° C. (way below the target growth rate of 3.4 nm/min characteristic of a reaction rate limited condition) for un-doped amorphous silicon and of about 1.2 nm/min for doped amorphous silicon are clearly not achieved from reaction rate limited conditions. Another reference shows an amorphous silicon deposition rate of only 2.0 nm/min @ 550° C. (again way below the target growth rate of 3.4 nm/min characteristic of a reaction rate limited condition): T. P. Chen, T. F. Lei, H. C. Lin, and C. Y. Chan, "Low temperature growth of silicon-boron layer by ultrahigh vacuum chemical vapor deposition", Appl. Phys. Lett. Vol. 64, No. 14, Apr. 4, 1994, pp. 1853–1855.

Figure 19:
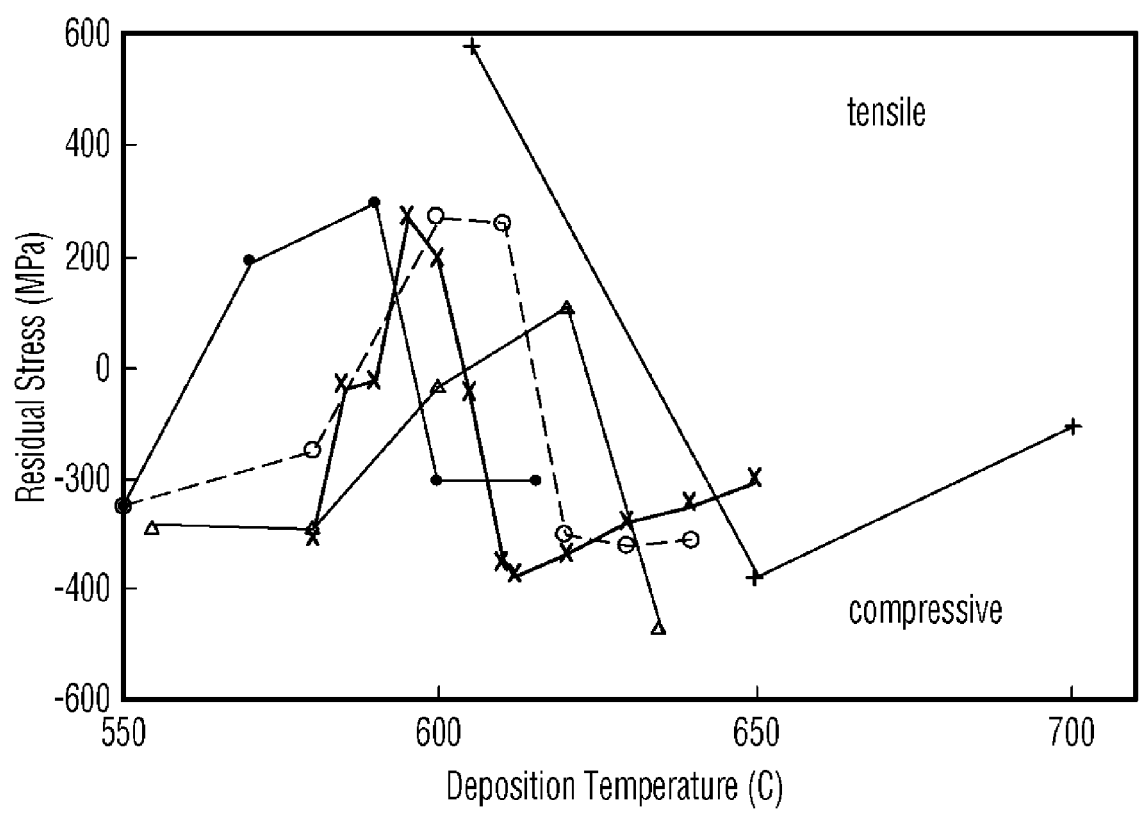
FIG. 19 is an example of non-repeatable mechanical properties of amorphous silicon deposited at temperatures between 550° C. and 575° C. under diffusion rate limited conditions.

Depositing amorphous silicon under non-reaction rate limited conditions will result in non-repeatable mechanical properties. Non-repeatable results can be observed in the various papers describing the mechanical properties of un-doped amorphous silicon deposited at temperatures between 550 and 575° C. An example of such non-repeatable results is shown in FIG. 19 extracted from the following reference: Jie Yang, Harold Kahn, An-Qiang He, Stephen M. Phillips and Arthur H. Heuer, "A new technique for producing large-area as-deposited zero-stress LPCVD polysilicon films: The multipoly process", IEEE Journal of microelectromechanical systems, Vol. 9, No. 4, December 2000, pp. 485–494.

Depositing amorphous silicon under reaction rate limited conditions will result in repeatable mechanical properties.

Figure 20:
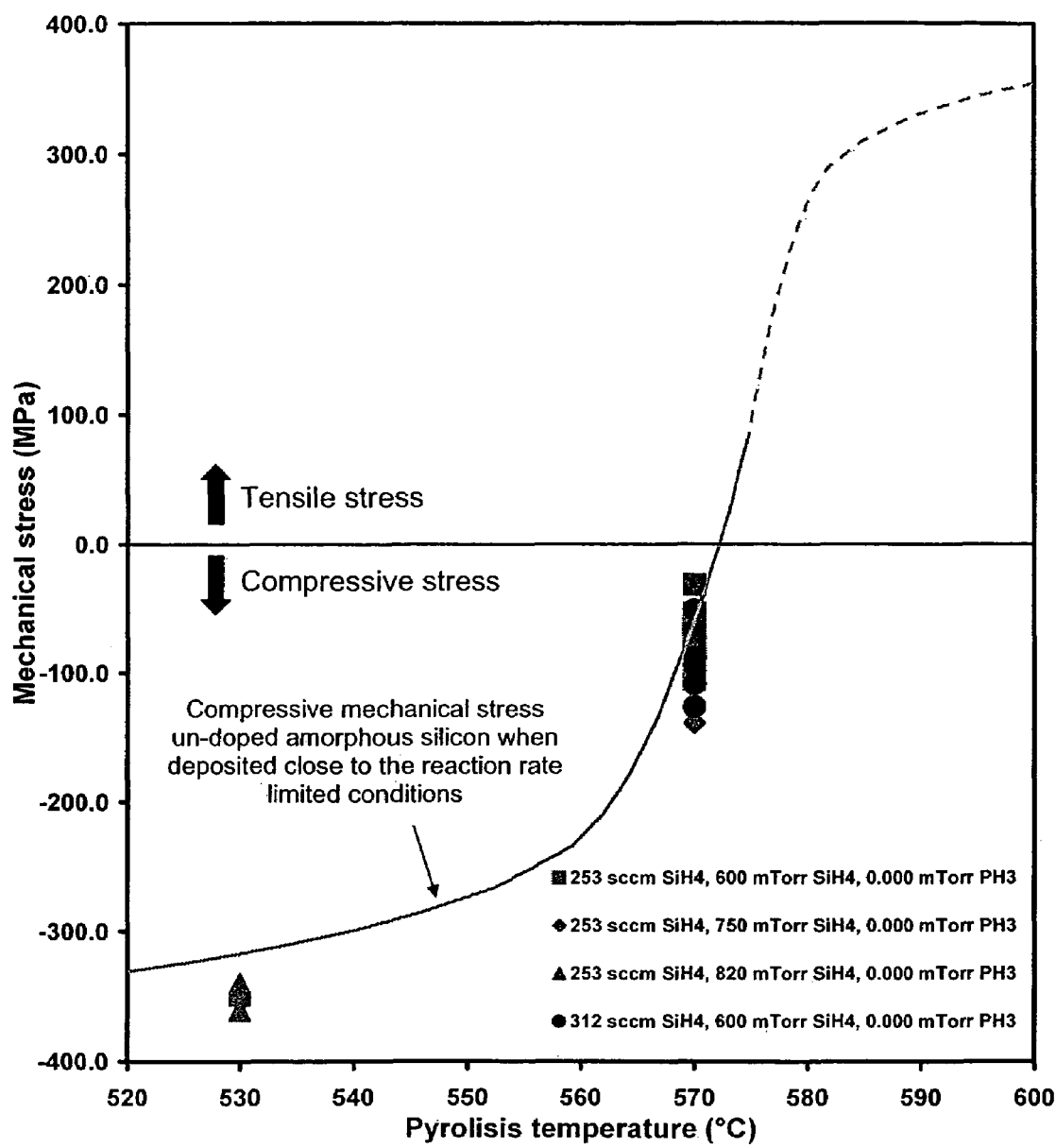
FIG. 20 shows the compressive mechanical stress of un-doped amorphous silicon using the pyrolisis of silane close to the reaction rate limited conditions.

FIG. 20 shows the compressive mechanical stress achieved with amorphous silicon layers deposited close to the reaction rate limited conditions:

h. Un-doped amorphous silicon growth rate of 1.7 nm/min @ 530° C.;
i. Un-doped amorphous silicon growth rate of 5.3 nm/min @ 570° C.

The following discussion will now show that it is possible to obtain a tensile stress as-deposited in-situ phosphorus-doped amorphous silicon layer which will compensate the compressive mechanical stress obtained with this un-doped amorphous silicon to achieve low mechanical stress conductive laminated structures without the need for any high-temperature diffusion and/or activation. This combination is an important aspect of the invention because the processing temperature being limited to the deposition temperature of the un-doped amorphous silicon and to the deposition temperature of the doped amorphous silicon, it allows the fabrication of MEMS over integrated circuits.

The growth parameters of tensile mechanical stress phosphorus-doped and electrically conductive amorphous silicon deposited at temperatures between 530° C. and 550° C.

Figure 21:
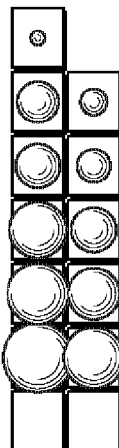
FIG. 21 shows the atomic radii of phosphorus and silicon.
Figure 21:
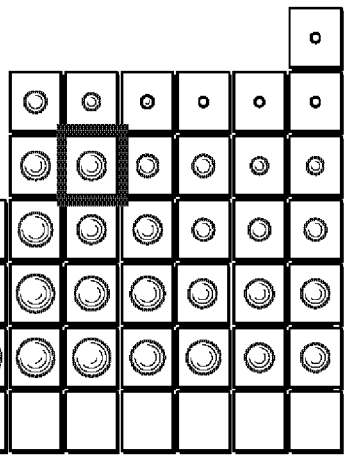
Figure 21:
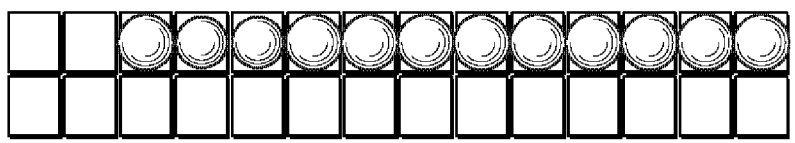
Figure 21:
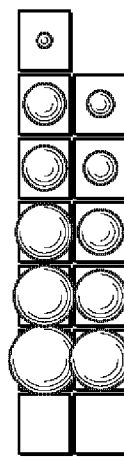
Figure 21:
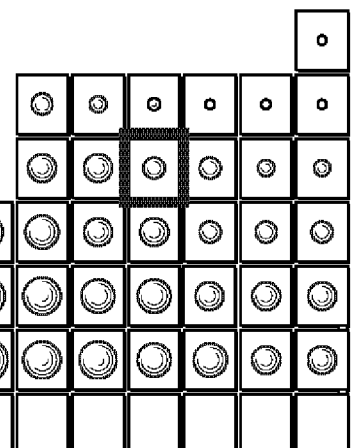
Figure 21:
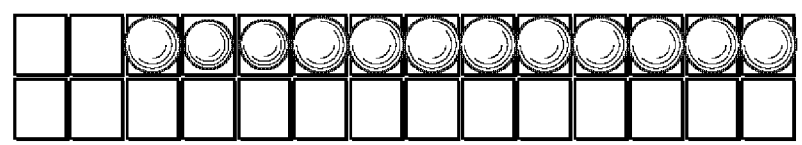

A careful analysis of the periodic table of FIG. 21 shows that phosphorus' 98 picometer atomic radius is much smaller then silicon's 111 picometer atomic radius. This simple observation has a very high impact because it predicts that it could be possible to use the phosphorus in-situ doping of silicon to convert the compressive mechanical stress of un-doped amorphous silicon deposited under reaction rate limited conditions into a tensile stress phosphorus-doped electrically conductive amorphous silicon and, potentially, into a zero-stress phosphorus-doped electrically conductive amorphous silicon.

This lattice contraction effect has been observed and characterized for single crystal silicon wafers in the following reference: Chang Seung Lee, Jong Hyun Lee, Chang Auck Choi, Kwangsoo No and Dang Moon Wee, "Effects of phosphorus on stress of multi-stacked polysilicon film and single crystalline silicon", J. Micromech. Microeng. 9 (1999) 252–263.

Figure 22:
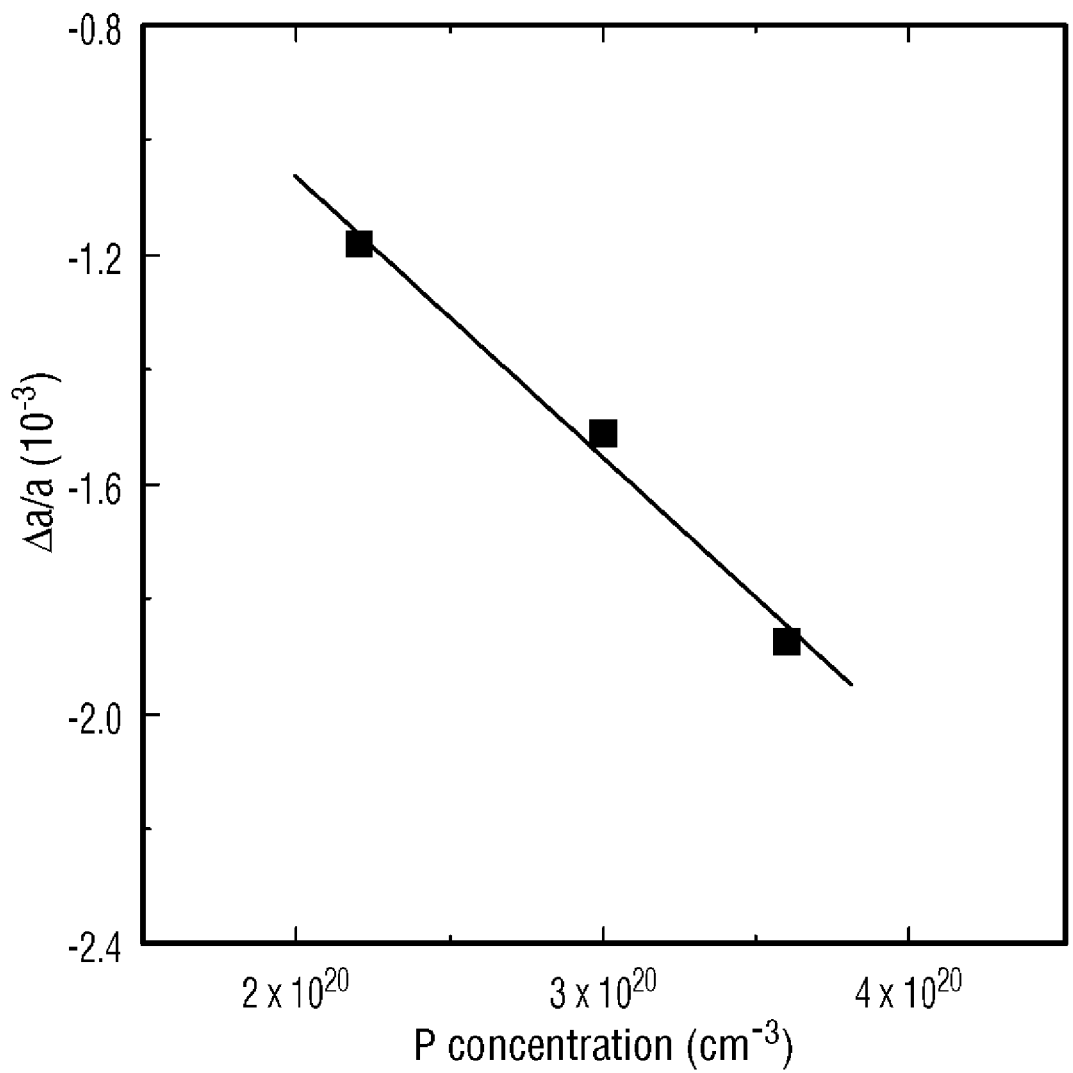
FIG. 22 shows the relative variation of lattice spacing of single crystal silicon wafers and the phosphorus doping level.

The upper reference shows that phosphorus atoms implanted in the silicon lattice of single crystal silicon wafers give rise to a lattice contraction and a tensile stress linearly proportional to the phosphorus doping. This tensile stress is reduced after high-temperature annealing. The relationship between the relative variation of lattice spacing of the single crystal silicon wafers and the phosphorus doping level is calculated from a high-resolution x-ray rocking curve as $-4.510^{-24}$ cm3 for phosphorus. The resulting lattice dilation coefficient curve $\Delta a/a$ for phosphorus is reproduced in FIG. 22. This upper reference also reports that these results are contrary to the results observed for polysilicon samples and explains the difference by the existence of grain boundaries in the polysilicon samples.

It will now be demonstrated that in-situ phosphorus-doping at a low temperature ranging between 530° C. and 550° C. can provoke the conversion of the compressive mechanical stress un-doped amorphous silicon into a tensile mechanical stress electrically conductive phosphorus-doped amorphous silicon. This new technique will have the following advantages for MEMS applications:

j. It will allow the fabrication of conductive laminated layers using un-doped compressive stress amorphous silicon and phosphorus-doped tensile stress electrically conductive amorphous silicon without the need for subsequent post-deposition high-temperature diffusions and/or activations to achieve conductive structures;
k. It will provide a uniform phosphorus doping throughout the amorphous silicon film thickness, thus eliminating the effects of micro-structural variations in the thickness direction of some mechanical properties;
l. It will eliminate the bending moments (causing out-of-plane deflections) of mechanically released structures.

The phosphorus incorporation rate into a growing amorphous silicon characterized by the following phosphine pyrolisis reaction:

m. $PH_3$ (gas to reach surface)→P (incorporation in Si)+ $3/2H_2$ (to eliminate from surface)
n. If the incoming rate of phosphine and the elimination rate of hydrogen are not limiting this pyrolisis reaction, the phosphorus incorporation should be reaction rate limited and should follow the following Arrhenius equation:

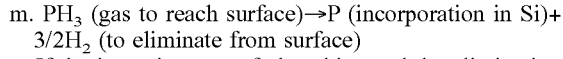

$$R=R_o \exp(-Ea'/kT)$$

where Ea' is phosphine's pyrolisis activation energy (eV), k is Boltzmann's constant and T is the temperature (K). Similarly to silane, if the incoming rate of phosphine is controlled and maintained constant during the growth of the amorphous silicon layer (depositing in reaction rate limited conditions) and if the elimination rate of hydrogen is also controlled and maintained constant during the growth of the doped amorphous silicon layer, then the growing amorphous silicon should uniformly incorporate the phosphorus atoms.

If the amount of incoming phosphine is controlled such that it does not limit phosphine's pyrolisis reaction at the amorphous silicon growth temperature (between 530° C. and 550° C.) then the phosphorus incorporation will also reach a reaction rate limited condition and the phosphorus incorporation into the growing phosphorus-doped amorphous silicon will be fixed and only dictated by the deposition temperature because the ratio of silane's and phosphine's activation energies is constant at a given growth temperature. This will result in a fixed phosphorus incorporation and potentially a fixed mechanical stress at a given growth temperature.

If the controlled amount of incoming phosphine is such that it does limit phosphine's pyrolisis reaction then the phosphorus incorporation will enter in a mass transport rate limited and the phosphorus incorporation into the growing amorphous silicon layer will be varied and controlled by three process parameters:

o. The deposition temperature;
p. The mass flow rate of phosphine entering the growth equipment;
q. The partial pressure of phosphine during growth.

Controlling the phosphorus incorporation and the properties such as the mechanical stress and bulk resistivity of an in-situ doped amorphous silicon deposited under mass transport rate limited conditions is quite demanding and should be avoided. Doping the growing amorphous silicon with just the right amount of phosphine to "properly feed" the growing surface with the right amount of phosphorus atoms required by the surface at the growth temperature will result in a stable process.

Since the amorphous silicon deposition is performed at relatively lower temperatures between 530° C. and 550° C. it is expected that the phosphorus incorporation and phosphorus-doped amorphous silicon growth rate could easily be adjusted in the reaction rate limited conditions by varying the flux of incoming phosphine on the surface (by varying the rate of incoming phosphine "feeding" the pyrolisis reaction via adjustments of the mass flow of phosphine incoming the pyrolisis equipment or, alternately, by varying the partial pressure of phosphine in equilibrium into the pyrolisis equipment via adjustments of the pumping rate at a given incoming rate of phosphine). If the phosphine pyrolisis reaction is rate limited, the phosphorus incorporation rate (bulk resistivity) and phosphorus-doped amorphous silicon growth rate would then be unaffected by these adjustments (i.e. there would be enough phosphine and not too much hydrogen to block the pyrolisis reactions of both, phosphine AND silane) and the phosphorus incorporation rate and phosphorus-doped amorphous silicon growth rate would then reach the maximum rates predicted by the two Arrhenius equations for that growth temperature:

Phosphorus-doped amorphous silicon growth rate of 1.7 nm/min @ 530° C.;
Phosphorus-doped amorphous silicon growth rate of 3.4 nm/min @ 550° C.;
Phosphorus-doped amorphous silicon growth rate of 5.3 nm/min @ 570° C.

Figure 23:
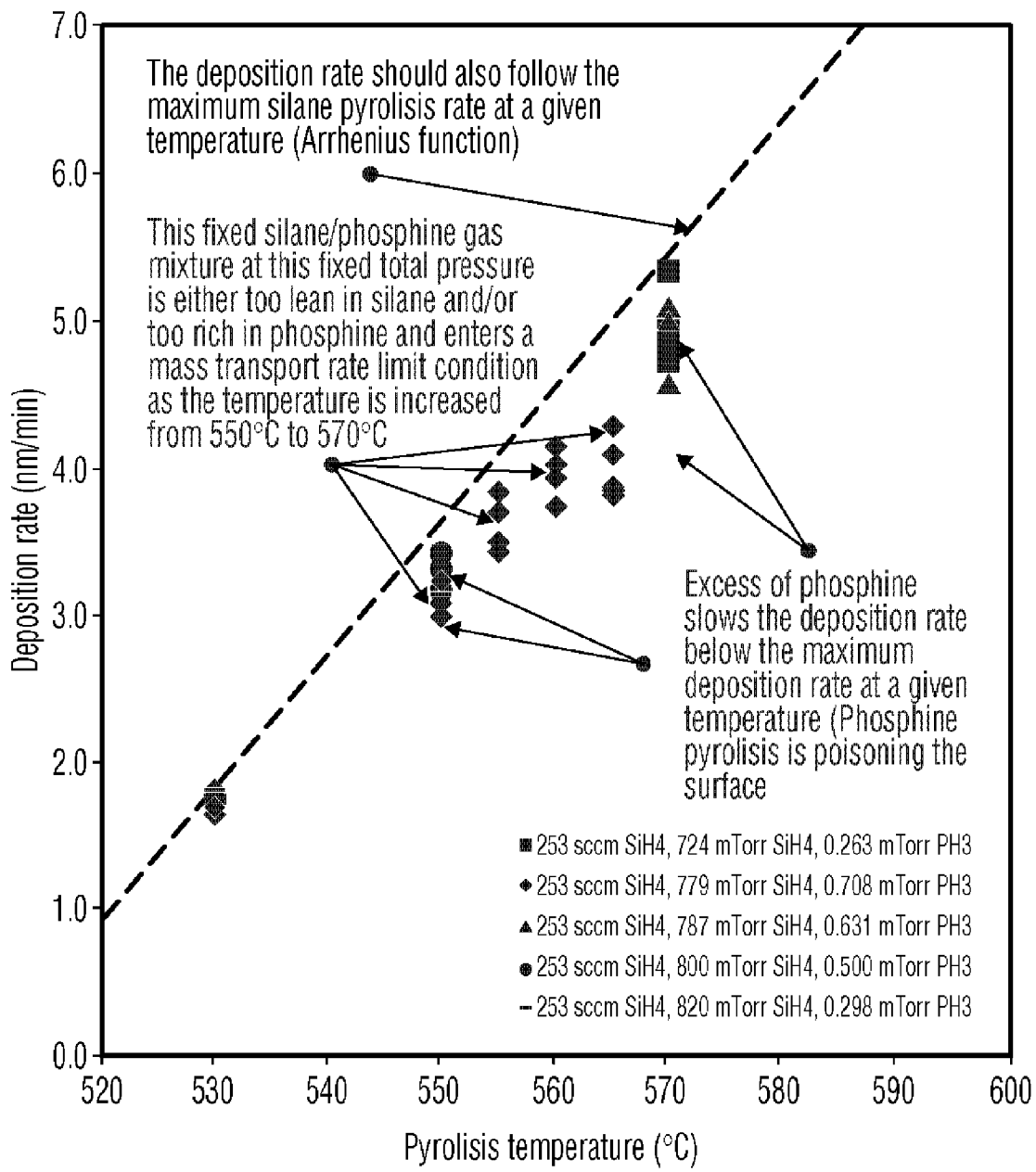
FIG. 23 shows the deposition of phosphorus-doped amorphous silicon using the pyrolisis of silane and phosphine.

FIG. 23 shows the growth rates of various phosphorus-doped layers deposited under various deposition conditions. Phosphine has a poisoning effect on the surface and that an excessive amount of phosphine slows-down the phosphorus-doped amorphous silicon growth rate between 530° C. and 570° C. The 253 sccm of silane is a slightly too low mass flow of silane in the equipment to ensure a reaction rate limited condition when phosphine is added to the gas mixture to incorporate phosphorus. Again, a slight increase in silane mass flow rate and a slight optimization (reduction) of the phosphine flow rate will ensure the desirable reaction rate limited condition.

Figure 24:
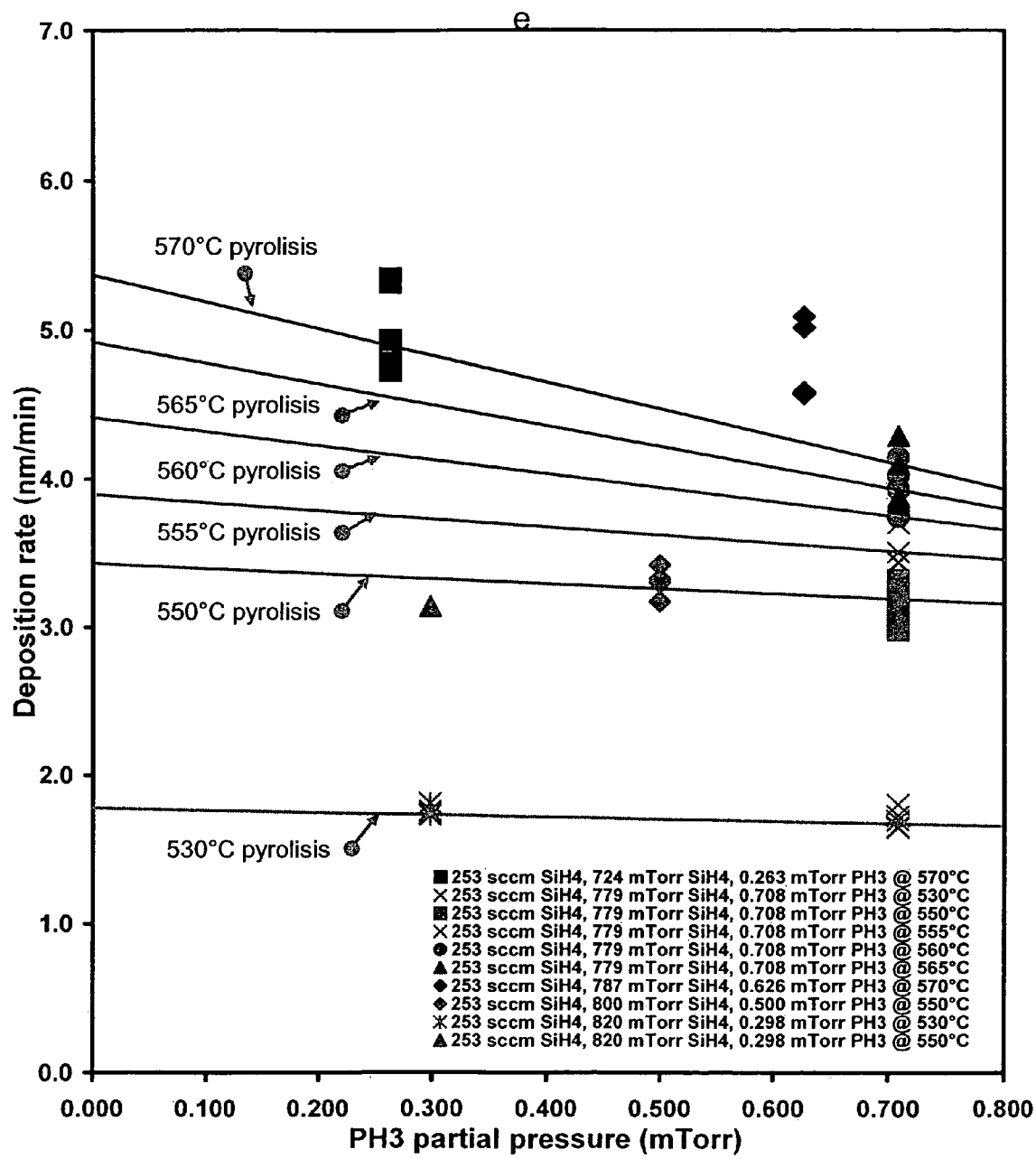
FIG. 24 shows the deposition of phosphorus-doped amorphous silicon using the pyrolisis of silane and phosphine.

FIG. 24 shows that the deposition rate of phosphorus-doped amorphous silicon is strongly affected by an increase in phosphine partial pressure when the deposition temperature increases above 550° C. This again supports the argument that the mass flow rate of silane for deposition at temperatures about 550° C. is slightly too low to ensure a reaction rate limited condition when a partial pressure of phosphine is gradually added to the gas mixture to incorporate phosphorus. Again, a slight increase in silane mass flow rate and a restriction of the phosphine flow rate to the optimum value will ensure the desirable reaction rate limited conditions allowing reproducible mechanical properties:

r. Phosphorus-doped amorphous silicon growth rate of 1.7 nm/min @ 530° C.;
s. Phosphorus-doped amorphous silicon growth rate of 3.4 nm/min @ 550° C.;
t. Phosphorus-doped amorphous silicon growth rate of 3.9 nm/min @ 555° C.;
u. Phosphorus-doped amorphous silicon growth rate of 4.4 nm/min @ 560° C.;
v. Phosphorus-doped amorphous silicon growth rate of 4.9 nm/min @ 565° C.;
w. Phosphorus-doped amorphous silicon growth rate of 5.3 nm/min @ 570° C.

Figure 25:
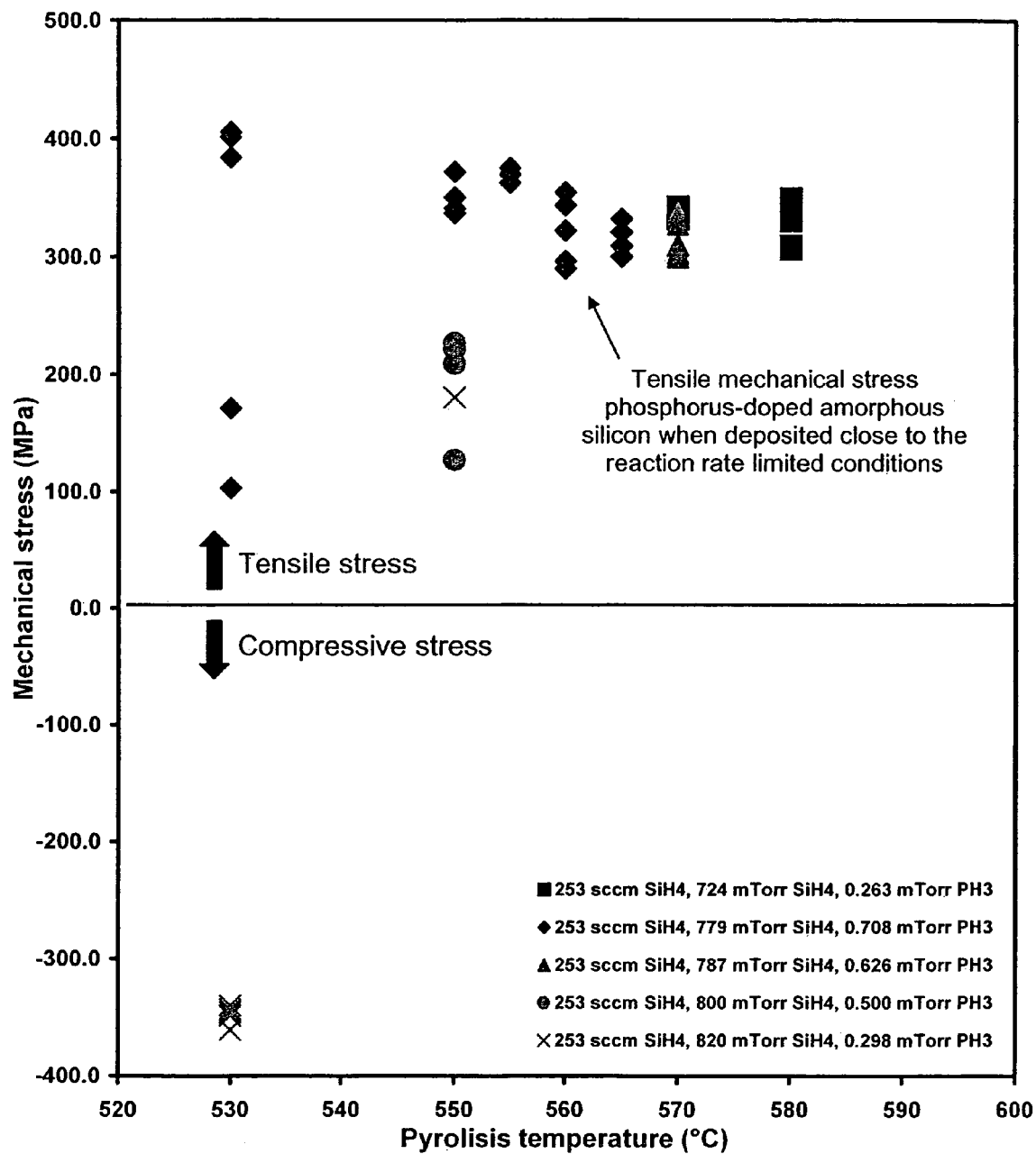
FIG. 25 shows the deposition of phosphorus-doped amorphous silicon using the pyrolisis of silane and phosphine.

FIG. 25 shows the spectacular result of the invention: Tensile mechanical stress phosphorus-doped electrically conductive amorphous silicon layers can be obtained when deposited close to these reaction rate limited conditions.

Figure 26:
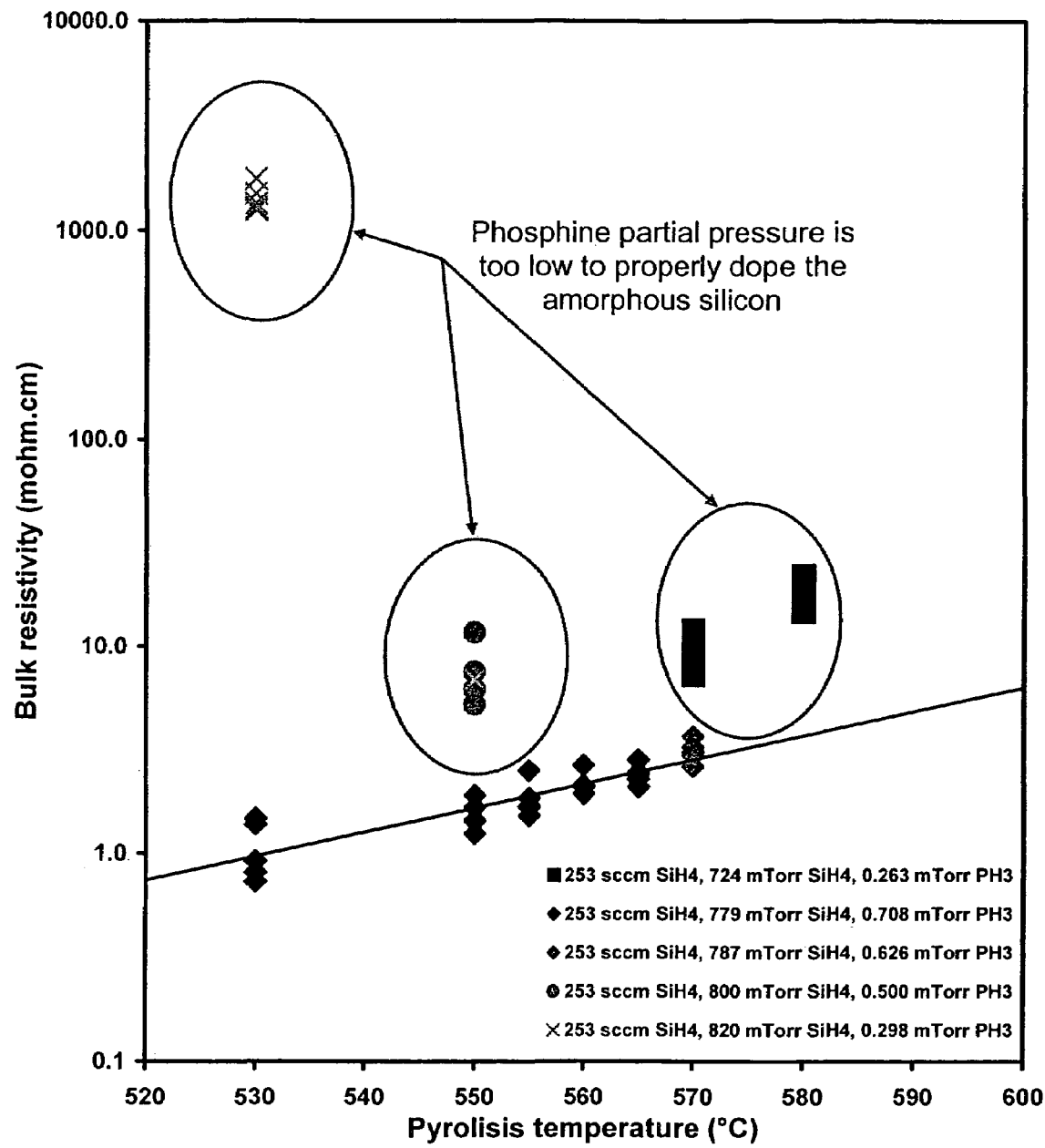
FIG. 26 shows the deposition of phosphorus-doped amorphous silicon using the pyrolisis of silane and phosphine.

FIG. 26 shows the bulk resistivity of the obtained in-situ phosphorus-doped tensile mechanical stress amorphous silicon deposited at a temperature of only 550° C.

Figure 1:
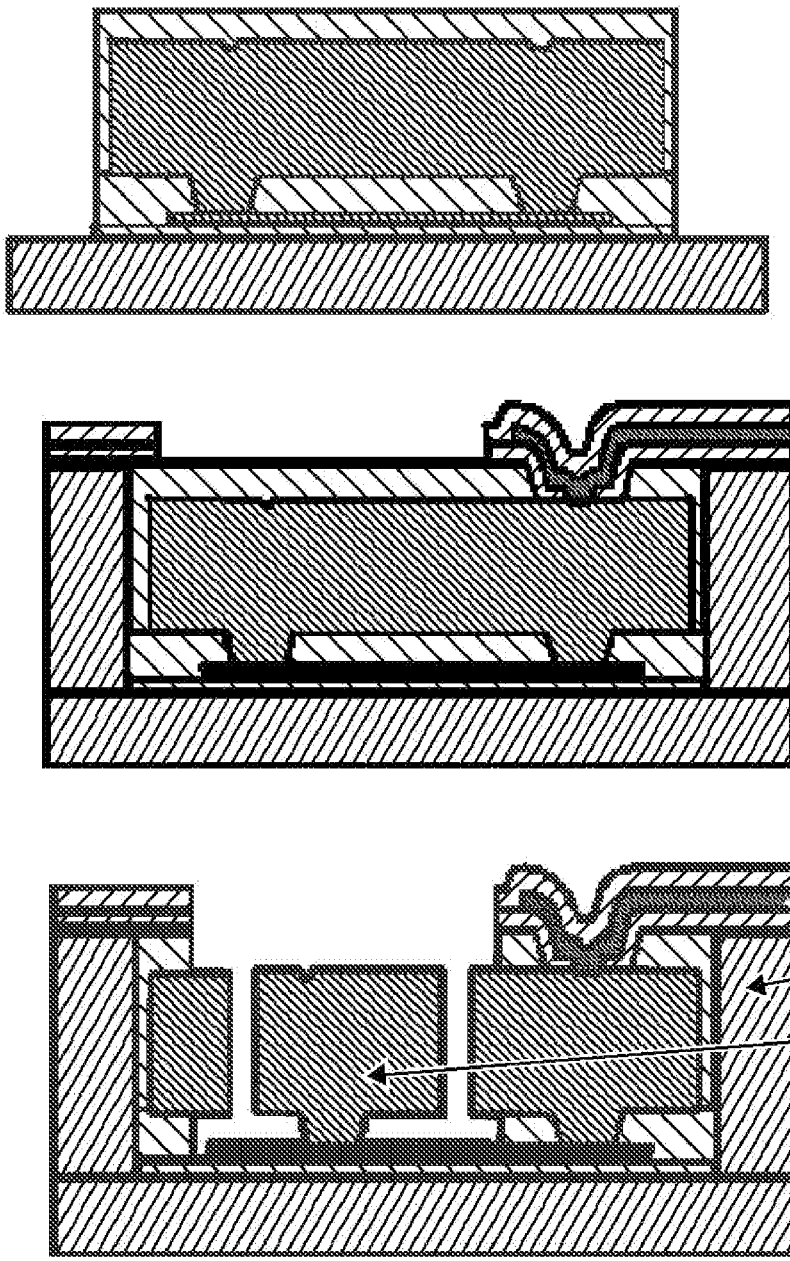
FIG. 1 illustrates Analog Devices' Modular prior art MEMS process.
Figure 2:
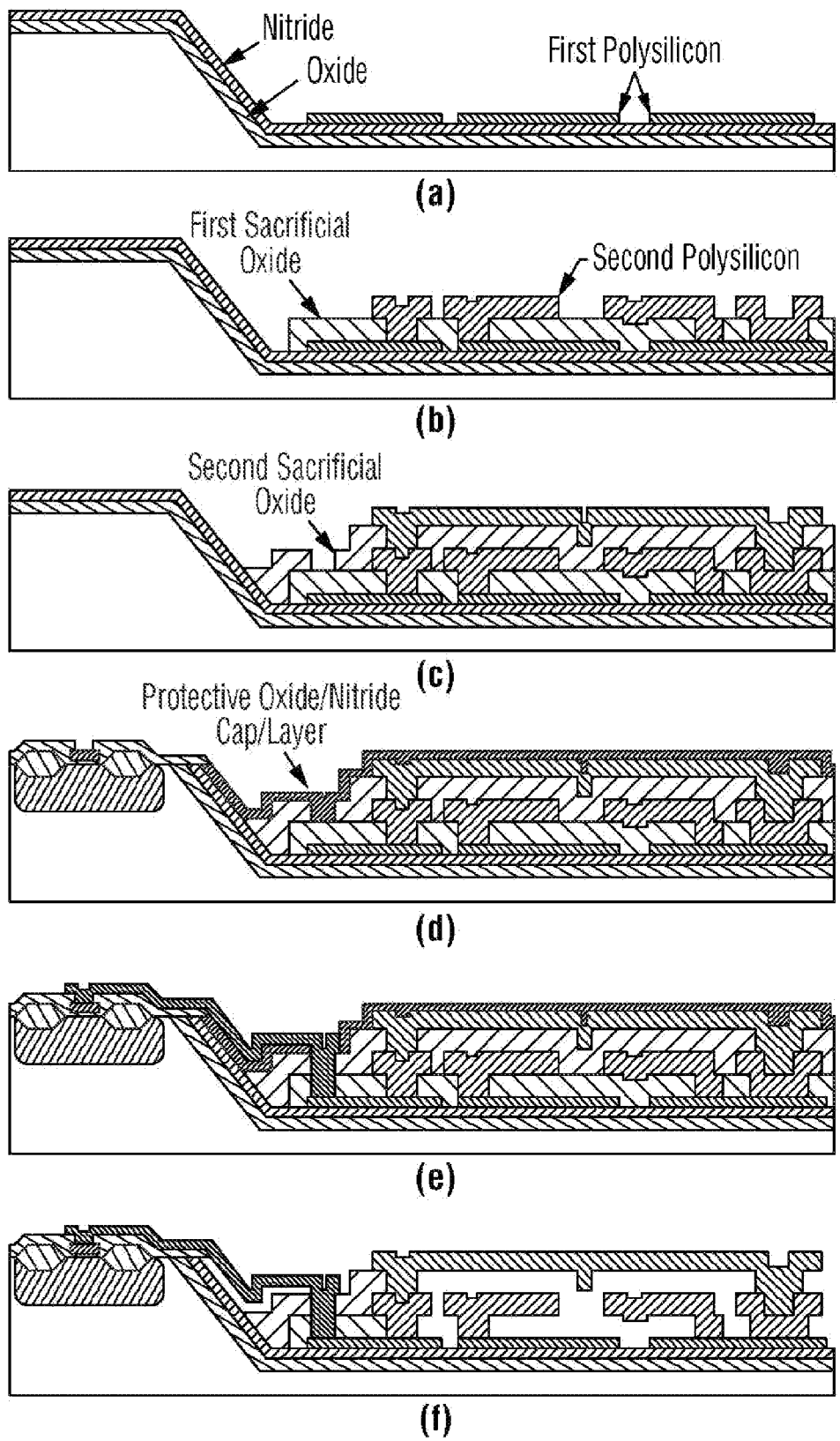
FIG. 2 illustrates SAIT's prior art MEMS process.
Figure 3:
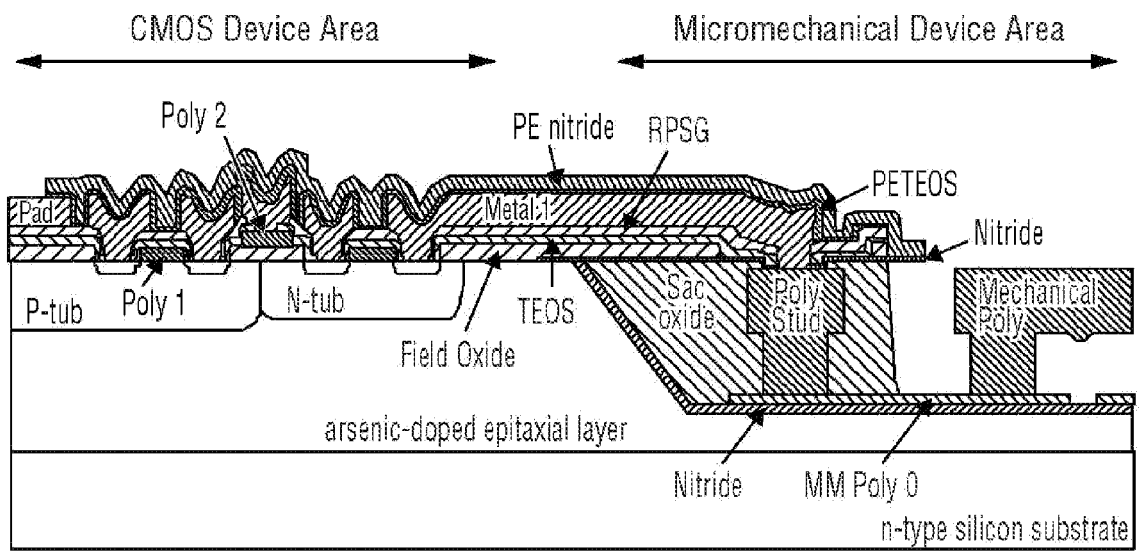
FIG. 3 illustrates Sandia's prior art IMEMS process.
Figure 4:
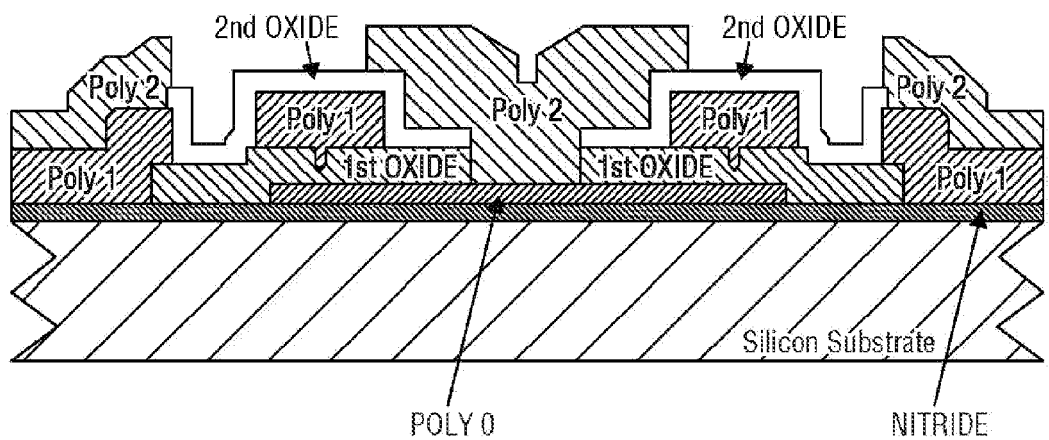
FIG. 4 illustrates NMMSCAP's MUMPs prior art process.
Figure 5:
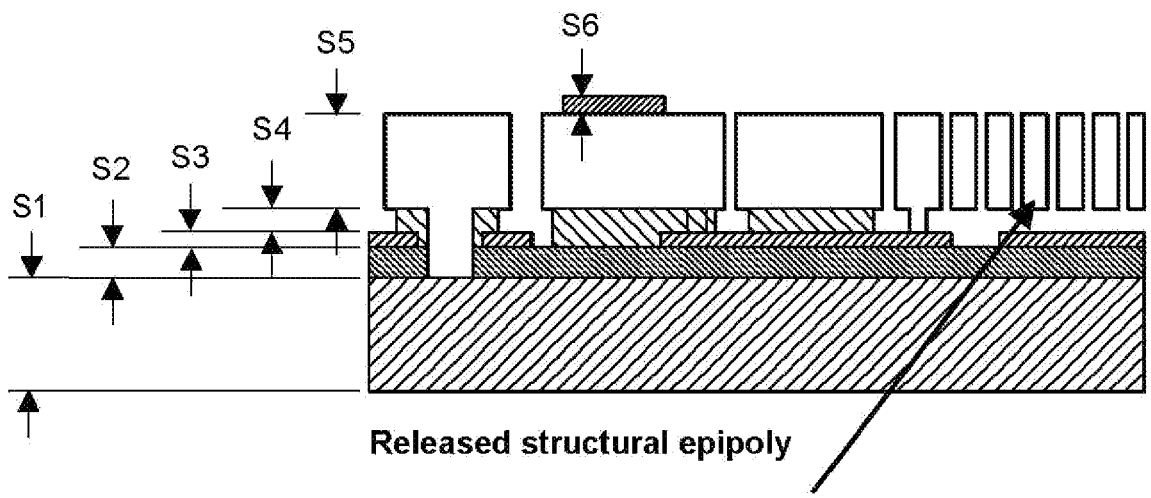
FIG. 5 illustrates Robert Bosch's prior art surface micromachining process.
Figure 6:
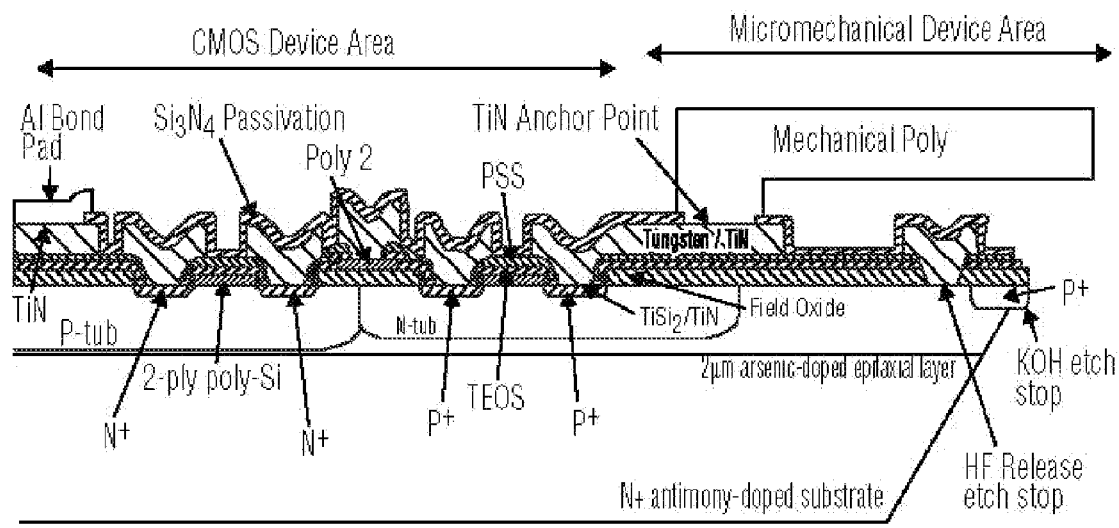
FIG. 6 illustrates Sandia's prior art CMOS-first, micro-mechanics-last MEMS process.
Figure 7:
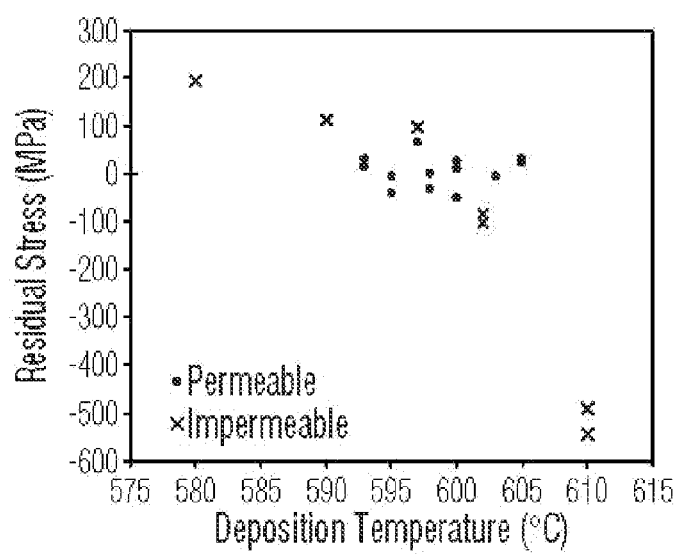
FIG. 7 illustrates UC Berkeley's prior art low-stress un-doped porous polysilicon.
Figure 7:
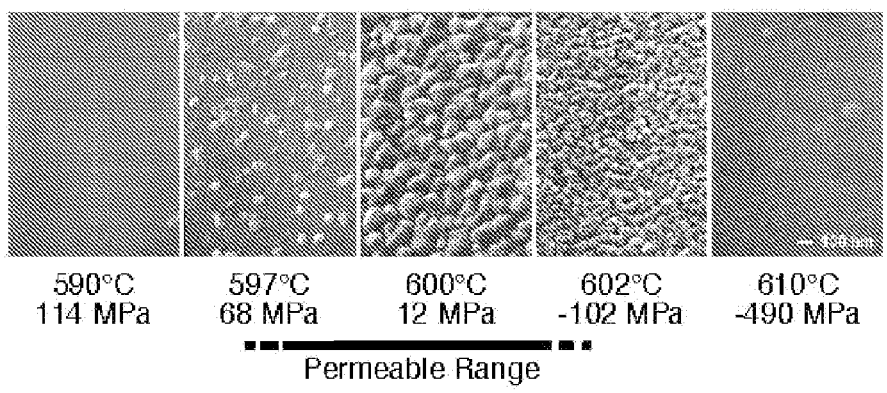
Figure 8:
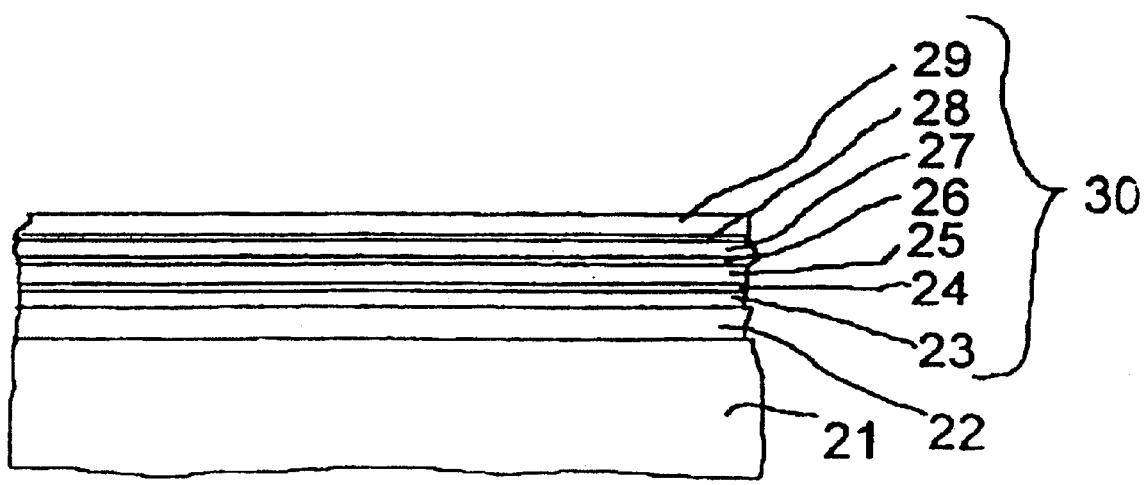
FIG. 8 illustrates prior art Siemens Aktiengesellschaft's low-stress laminated silicon structure.
Figure 9:
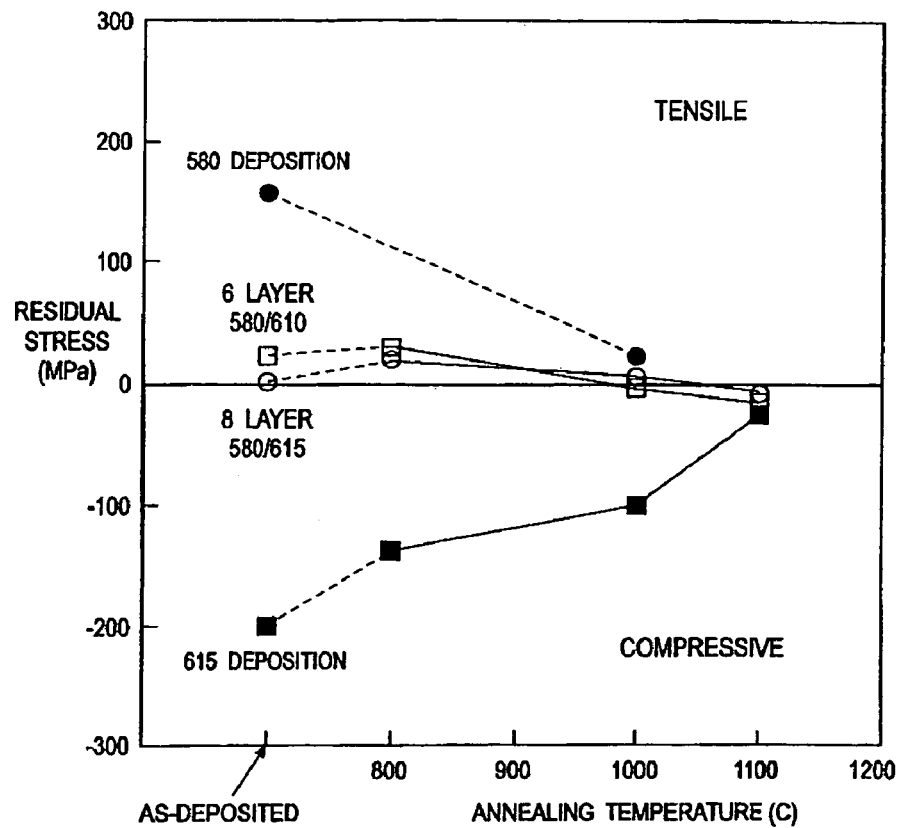
FIG. 9 illustrates Case Western Reserve prior art University' slow-stress laminated silicon structures.
Figure 9:
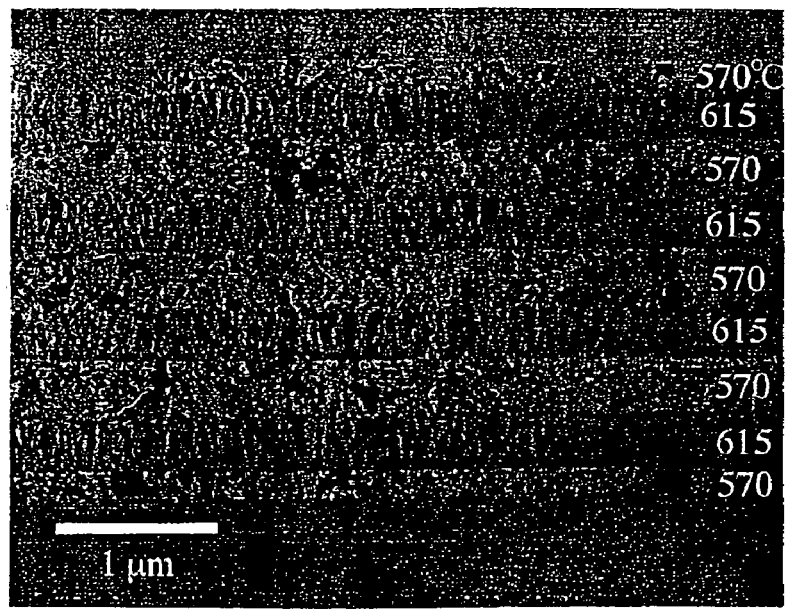
Figure 10:
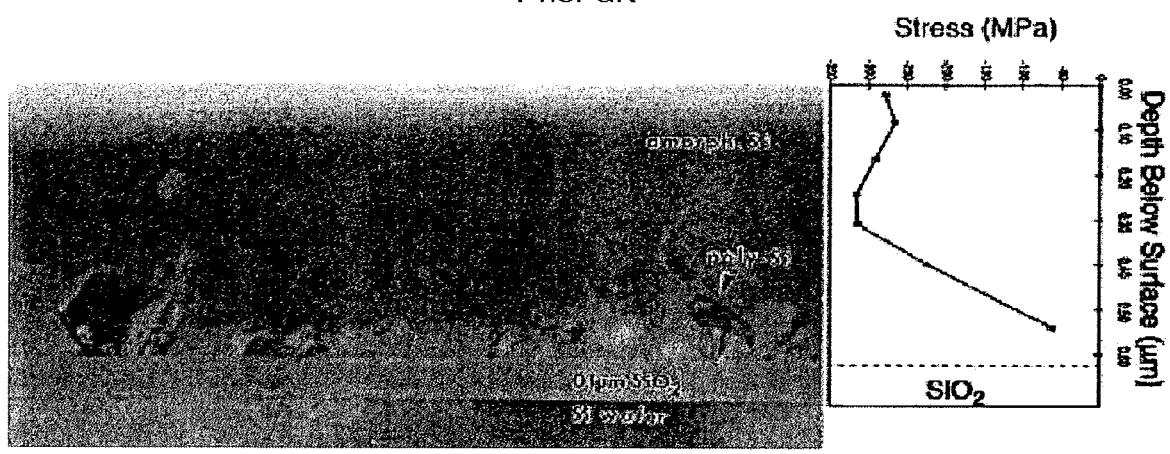
FIG. 10 illustrates UC Berkeley's prior art low-stress re-crystallized in-situ doped polysilicon.

The combination of un-doped compressive stress amorphous silicon and of phosphorus-doped tensile stress electrically conductive amorphous silicon in the fabrication of low residual stress structural silicon as to fabricate MEMS over integrated circuits The combination of compressive mechanical stress un-doped amorphous silicon shown in FIG. 20 with the tensile mechanical stress phosphorus-doped electrically conductive amorphous silicon shown in FIG. 26 allows the fabrication of symmetrically laminated structures with no residual stress similar to the ones described by the cited prior art references from Siemens Aktiengesellschaft (FIG. 8) and Case Western Reserve University (FIG. 9): Markus Biebl, U.S. Pat. No. 5,753,134, "Method for producing a layer with reduced mechanical stresses", Siemens Aktiengesellschaft, filed on Nov. 23, 1994 and granted on May 19, 1998; Arthur H. Heuer, Harold Kahn and Jie Yang, U.S. Pat. No. 6,268,068, "Low stress polysilicon film and method for producing same", Case Western Reserve University, filed on Mar. 1, 1999 and granted on Jul. 31, 2001; Arthur H. Heuer, Harold Kahn and Jie Yang, U.S. Pat. No. 6,465,045, "Low stress polysilicon film and method for producing same", Case Western Reserve University, filed on Oct. 18, 2000 and granted on Oct. 15, 2002; Arthur H. Heuer, Harold Kahn, Jie Yang and Stephen M. Phillips, U.S. Pat. No. 6,479,166, "Large area polysilicon films with predetermined stress characteristics and method for producing same", Case Western Reserve University, filed on May 1, 2000 and granted on Nov. 12, 2002; Jie Yang, Harold Kahn, An-Qiang He, Stephen M. Phillips and Arthur H. Heuer, "A new technique for producing large-area as-deposited zero-stress LPCVD polysilicon films: The multipoly process", IEEE Journal of microelectromechanical systems, Vol. 9, No. 4, December 2000, pp. 485–494.

The electronic components in the device can, for example, be an N-channel metal oxide semiconductor (NMOS) device; a P-channel metal oxide semiconductor (PMOS) device; a complementary metal oxide semiconductor (CMOS) device; an extended drain metal oxide semiconductor (DMOS) device; a bipolar device; a bipolar-CMOS or BiCMOS device; a bipolar-DMOS or BCDMOS device; a high-voltage NMOS device; a high-voltage PMOS device; a high-voltage CMOS device; a high-voltage DMOS device; a high-voltage bipolar device; a high-voltage BiCMOS device; a bipolar-DMOS or BCDMOS device, or combinations thereof.

The high-voltage can be higher than 5 volts but lower than 1,200 volts; higher than 5 volts but lower than 600 volts; higher than 5 volts but lower than 300 volts; higher than 5 volts but lower than 200 volts; higher than 5 volts but lower than 100 volts; higher than 5 volts but lower than 40 volts; higher than 5 volts but lower than 20 volts; higher than 5 volts but lower than 10 volts.

The interconnect layer can comprise a layered structure ensuring thermally stable interconnects, comprising a titanium-based under-layer, an aluminum-based middle-layer, and a titanium-based over-layer. The titanium-based under-layer may be titanium, Ti, titanium nitride, TiN or combinations of Ti and TiN; the aluminum-based middle-layer may be aluminum, Al; an aluminum-silicon binary alloy containing less then 2.0 wt % of silicon, as to ensure a silicon-eutectic temperature of more than 567° C.; an aluminum-copper binary alloy containing less than 6.0 wt % of copper, as to ensure a silicon-eutectic temperature of more than 548° C.; a binary aluminum alloy having an eutectic temperature higher than 545° C.; an aluminum-silicon-copper ternary alloy containing less than 2.0 wt % of silicon and less than 6.0 wt % of copper; a ternary aluminum alloy having an eutectic temperature higher than 545° C.; and said titanium based over-layer may be titanium, Ti, titanium nitride, TiN or combinations of Ti and TiN.

The under-layer may be deposited by a Physical vapor deposition, PVD; Reactive PVD; Chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; Rapid thermal processing, RTP; or a combination thereof.

The aluminum-based middle-layer may be deposited Physical vapor deposition, PVD; Chemical vapor deposition, CVD; Low pressure chemical vapor deposition, LPCVD; Metal-organic chemical vapor deposition, MOCVD; or a combination thereof.

The over-layer may be deposited by Physical vapor deposition, PVD; Reactive PVD; Chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; Rapid thermal processing, RTP; or a combination thereof.

The interconnect layer can also have a layered structure comprising a tantalum-based under-layer; a copper-based middle layer; a tantalum-based over-layer.

The tantalum based under-layer can be deposited by physical vapor deposition, PVD; chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; or a combination thereof.

The tantalum-based underlayer may be deposited by physical vapor deposition, PVD; chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; or a combination thereof, the copper-based middle-layer may be deposited by physical vapor deposition, PVD; chemical vapor deposition, CVD; Low pressure chemical vapor deposition, LPCVD; Metal-organic chemical vapor deposition, MOCVD; Electroplating; Electroless plating; or combinations thereof; and the over-layer may be deposited by physical vapor deposition, PVD; Chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; or combinations thereof.

The interconnect layer can also have a layered structure comprising a titanium-based under-layer and a tungsten-based layer. The titanium-based under-layer may be titanium, Ti, titanium nitride, TiN or combinations of Ti and TiN; and the tungsten-based layer is CVD-W.

The titanium-based under-layer may be deposited by: Physical vapor deposition, PVD; Reactive PVD; Chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; Rapid thermal processing, RTP; Combinations thereof. The tungsten-based layer may be deposited by: Chemical vapor deposition, CVD; Low pressure chemical vapor deposition, LPCVD; Plasma-enhanced chemical vapor deposition, PECVD; Inductively coupled plasma, ICP; Metal-organic chemical vapor deposition, MOCVD; combinations thereof.

The interconnect layer may also be a layered interconnection structure comprising a titanium-based under-layer; a tungsten-based middle-layer, such as CVD-W; a titanium-based over-layer, such as titanium, Ti, titanium nitride, TiN or combinations of Ti and TiN.

In this case the under-layer may be deposited by: Physical vapor deposition, PVD; Reactive PVD; Chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; Rapid thermal processing, RTP; Combinations thereof.

The tungsten-based middle-layer may be deposited by: Chemical vapor deposition, CVD; Low pressure chemical vapor deposition, LPCVD; Plasma-enhanced chemical vapor deposition, PECVD; Inductively coupled plasma, ICP; Metal-organic chemical vapor deposition, MOCVD; Combinations thereof these.

The over-layer may be deposited by: Physical vapor deposition, PVD; Reactive PVD; Chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; Rapid thermal processing, RTP; or combinations thereof.

The protective layer may be an un-doped amorphous silicon layer a-Si; a phosphorus-doped amorphous silicon layer a-Si(P); a titanium, Ti, layer; a titanium nitride, TiN, layer; an aluminum alloy layer; a plasma-enhanced chemical vapor deposited, PECVD, silicon nitride layer; a spin-on polymer layer; or a combination thereof.

The protective layer may be deposited by physical vapor deposition, PVD; Reactive PVD; Chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; Rapid thermal processing, RTP, or combinations thereof.

The sacrificial layer may be a silicate glass, SG, layer; a phosphorus-doped silicate glass, PSG, layer; a boron-doped silicate glass, BSG, layer; a boron- and phosphorus-doped silicate glass, BPSG, layer; a tetraethyl-ortho-silicate-glass, TEOS, layer; a fluorinated dielectric; a highly porous dielectric; a silicate spin-on glass, SOG, layer; a phosphorus-doped silicate SOG layer or; combinations thereof.

The sacrificial layer may be deposited by: chemical vapor deposition, CVD; Low pressure chemical vapor deposition, LPCVD; Plasma enhanced chemical vapor deposition, PECVD; Inductively coupled plasma, ICP; Metal-organic chemical vapor deposition, MOCVD; Spin-on; combinations thereof.

We claim:

1. A method fabricating a micro-electro-mechanical (MEM) device and an electronic device on a common substrate comprising the steps of:
    fabricating said electronic device comprising a plurality of electronic components on said common substrate;
    depositing a thermally stable interconnect layer on said electronic device;
    encapsulating the interconnected electronic device with a protective layer;
    forming a sacrificial layer over said protective layer;
    opening holes in the sacrificial layer and said protective layer to allow the connection of the MEM device to said electronic device;
    fabricating said MEM device by growing and patterning over said sacrificial layer at a temperature between 520 and 570° C. a laminated structure comprising at least one layer of un-doped amorphous silicon in compressive stress and at least one stress-compensating layer of in situ phosphorus-doped amorphous silicon in tensile stress;

said un-doped amorphous silicon being grown by the pyrolisis of silane, and said phosphorus doped amorphous silicon being grown by the pyrolisis of silane in the presence of phosphine;

said silane being introduced at a flow rate sufficient to ensure that the pyrolisis of silane is reaction rate limited; and removing at least a portion of said sacrificial layer to expose the MEM device comprising said laminated structure of un-doped amorphous silicon and phosphorous-doped amorphous silicon.

2. The method of claim 1, wherein said interconnect layer includes a contact material incorporating a refractory material ensuring thermally stable contact resistance to N+ doped silicon, P+ doped silicon, and polysilicon.

3. The method of claim 2, wherein said contact material is selected from the group consisting of titanium Ti; titanium-tungsten alloy, TiW; titanium nitride, TiN; titanium silicide, TiSi2; and combinations thereof.

4. The method of claim 1, wherein the interconnect layer comprises a material selected from the group consisting of: aluminum; an aluminum-silicon binary alloy plug containing less then 2.0 wt % of silicon, as to ensure a silicon-eutectic temperature of more then 567° C.; an aluminum-copper binary alloy plug containing less than 6.0 wt % of copper to ensure a silicon-eutectic temperature of more than 548° C.; another binary aluminum alloy plug having an eutectic temperature higher than 545° C.; an aluminum-silicon-copper ternary alloy containing less than 2.0 wt % of silicon and less than 6.0 wt % of copper; a ternary aluminum alloy having an eutectic temperature higher than 545° C., Copper; Tungsten; or a combination thereof.

5. The method of claim 1, wherein the interconnect layer comprises a layered structure ensuring thermally stable interconnects, said layered interconnection structure comprising a titanium-based under-layer, an aluminum-based middle-layer, and a titanium-based over-layer.

6. The method of claim 5, wherein said titanium-based under-layer is selected from the group consisting of: titanium, Ti, titanium nitride, TiN or combinations of Ti and TiN; said an aluminum-based middle-layer is selected from the group consisting of: aluminum, Al; an aluminum-silicon binary alloy containing less then 2.0 wt % of silicon, as to ensure a silicon-eutectic temperature of more than 567° C.; an aluminum-copper binary alloy containing less than 6.0 wt % of copper, as to ensure a silicon-eutectic temperature of more than 548° C.; a binary aluminum alloy having an eutectic temperature higher than 545° C.; an aluminum-silicon-copper ternary alloy containing less than 2.0 wt % of silicon and less than 6.0 wt % of copper; a ternary aluminum alloy having an eutectic temperature higher than 545° C.; and said titanium based over-layer is selected from the group consisting of: titanium, Ti, titanium nitride, TiN or combinations of Ti and TiN.

7. The method of claim 1, wherein said interconnect layer has a layered structure comprising a tantalum-based under-layer; a copper-based middle layer; a tantalum-based over-layer.

8. The method of claim 1, wherein the interconnect layer comprises a layered interconnection structure comprising a titanium-based under-layer and a tungsten-based layer.

9. The method of claim 8, wherein said titanium-based under-layer is selected from the group consisting of: titanium, Ti, titanium nitride, TiN or combinations of Ti and TiN; and said tungsten-based layer is CVD-W.

10. The method of claim 1, wherein the interconnect layer is a layered interconnection structure comprising a titanium-based under-layer; a tungsten-based middle-layer, such as CVD-W; a titanium-based over-layer, such as titanium, Ti, titanium nitride, TiN or combinations of Ti and TiN.

11. The method as claimed in claim 10, wherein said titanium-based under-layer is selected from the group consisting of titanium, Ti, titanium nitride, TiN or combinations thereof; said tungsten-based middle-layer is CVD-W; and said titanium-based over-layer is selected from the group consisting of: titanium, Ti, titanium nitride, TiN or combinations of Ti and TiN.

12. The method of claim 1 wherein said protective layer comprises a layer selected from the group consisting of: an un-doped amorphous silicon layer a-Si; a phosphorus-doped amorphous silicon layer a-Si(P); a titanium, Ti, layer; a titanium nitride, TiN, layer; an aluminum alloy layer; a plasma-enhanced chemical vapor deposited, PECVD, silicon nitride layer; a spin-on polymer layer; or a combination thereof.

13. The method of claim 1, wherein said sacrificial layer is selected from the group consisting of: a silicate glass, SG, layer; a phosphorus-doped silicate glass, PSG, layer; a boron-doped silicate glass, BSG, layer; a boron- and phosphorus-doped silicate glass, BPSG, layer; a tetraethyl-orthosilicate-glass, TEOS, layer; a fluorinated dielectric; a highly porous dielectric; a silicate spin-on glass, SOG, layer; a phosphorus-doped silicate SOG layer; or combinations thereof.

14. The method of claim 1, wherein the opening of the holes in the sacrificial layer and in the protective layer permit the establishment of connections to a circuit element selected from the group consisting of: an N+ junction; a P+ junction; a polysilicon layer; an interconnection; or combinations thereof.

15. The method of claim 1, wherein said at least one amorphous silicon layer is deposited at a temperature between 530 and 550° C.

16. The method of claim 1, wherein said at least one layer of amorphous silicon is deposited using silane partial pressure of less than 5000 mTorr.

17. The method of claim 1, wherein said at least one layer of amorphous silicon is deposited using silane partial pressure of between 100 and 500 mTorr.

18. The method of claim 1, wherein said at least one layer of amorphous silicon is phosphorus-doped using a phosphine partial pressure of less than 5 mTorr.

19. The method of claim 1, wherein said at least one layer of amorphous silicon is phosphorus-doped using a phosphine partial pressure of between 0.10 and 0.50 mTorr.

20. The method of claim 1, wherein said at least one layer of phosphorus-doped amorphous silicon has a bulk resistivity of less than 1000 mohm·cm.

21. The method of claim 1, wherein said laminated structure has a low absolute stress gradient of less than 5 MPa/µm.

22. The method of claim 1, wherein the flow rate of silane is at least 253 sccm.

23. The method of claim 1, wherein the interconnect layer comprises a TiN/AlSiCu/TiN layered structure.

* * * * *